United States Patent
Schultz et al.

(10) Patent No.: US 6,489,837 B2
(45) Date of Patent: Dec. 3, 2002

(54) DIGITALLY CONTROLLED IMPEDANCE FOR I/O OF AN INTEGRATED CIRCUIT DEVICE

(75) Inventors: David P. Schultz, San Jose; Suresh M. Menon, Sunnyvale; Eunice Y. D. Hao, Saratoga; Jason R. Bergendahl, Campbell; Jian Tan, Milpitas, all of CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/007,167

(22) Filed: Nov. 30, 2001

(65) Prior Publication Data

US 2002/0101278 A1 Aug. 1, 2002

Related U.S. Application Data

(63) Continuation-in-part of application No. 09/684,539, filed on Oct. 6, 2000.

(51) Int. Cl.$^7$ ................................................. G05F 1/10
(52) U.S. Cl. ................... 327/541; 327/566; 365/230.03
(58) Field of Search ................................ 327/530, 538, 327/540, 541, 543, 544–546, 564–566; 326/37, 38, 41, 47; 365/230.03, 230.06

(56) References Cited

U.S. PATENT DOCUMENTS

| | | | |
|---|---|---|---|
| 5,134,311 A | | 7/1992 | Biber et al. |
| 5,287,536 A | * | 2/1994 | Schreck et al. ............. 326/106 |
| 5,463,326 A | | 10/1995 | Raje |
| 5,506,541 A | | 4/1996 | Herndon |
| 5,559,441 A | | 9/1996 | Desroches |
| 5,949,268 A | | 9/1999 | Miura et al. |
| 6,087,847 A | | 7/2000 | Mooney et al. |
| 6,094,069 A | | 7/2000 | Magane et al. |
| 6,232,814 B1 | | 5/2001 | Douglas, III |
| 6,310,815 B1 | * | 10/2001 | Yamagata et al. ..... 365/230.03 |
| 6,339,318 B1 | * | 1/2002 | Tanaka ........................ 327/541 |

FOREIGN PATENT DOCUMENTS

| | | |
|---|---|---|
| EP | 0 978 943 A2 | 2/2000 |

OTHER PUBLICATIONS

Thaddeus J. Gabara; "Digitally Adjustable Resistors in CMOS for High–Performance Applications"; 1992 IEEE Journal of Solid–State Circuits, Aug. 1992, No. 8; New York; pp. 1176–1185.

Aris Balastsos et al., "TA 10.4 Low–Skew Clock Generator with Dynamic Impedance and Delay Matching"; 1999 IEEE International Solid–State Circuits Conference; 0–7803–5129–0/99.

(List continued on next page.)

*Primary Examiner*—My-Trang Nuton
(74) *Attorney, Agent, or Firm*—E. Eric Hoffman; H. C. Chan

(57) ABSTRACT

A system for controlling the impedances of circuits on an integrated circuit chip is provided. At least one circuit is selected to operate as a p-channel reference circuit, and at least one circuit is selected to operate as an n-channel reference circuit. Other circuits are selected to operate as circuits and/or line termination circuits. A digitally controlled impedance (DCI) circuit controls the p-channel reference circuit to determine a desired configuration of p-channel transistors for use in the circuits. The DCI circuit further controls the n-channel reference circuit to determine a desired configuration of n-channel transistors for use in the circuits. The DCI circuit takes into account such factors as resistances of p-channel transistors in the p-channel reference circuit, resistances of n-channel transistors in the n-channel reference circuit, as well as temperature, voltage and process variations. The DCI circuit relays information identifying the desired configurations of the n-channel and p-channel transistors to the circuits. The circuits are then configured in response to this information.

24 Claims, 11 Drawing Sheets

OTHER PUBLICATIONS

Toshiro Takahashi et al.; "TA 10.1 110GB/s Simultaneous Bi–Directional Transceivers Logic Synchronized with a System Clock"; 1999 IEEE International Solid–State Circuits Conference; 0–7803–5129–0/99.

Sai Vishwanthaiah et al.; "TP 15.1 Dynamic Termination Output Driver for a 600MHz Microprocessor"; 2000 IEEE International Solid–State Circuits Conference; 0–7803–5853–8/00.

* cited by examiner

DIGITALLY CONTROLLED IMPEDANCE FOR I/O OF AN INTEGRATED CIRCUIT DEVICE

RELATED APPLICATIONS

This application is a cip of Ser. No. 09/684,539, Oct. 6, 2000.

FIELD OF THE INVENTION

The present invention relates to an input/output circuit for an integrated circuit. More specifically, the present invention relates to a controlled impedance for an input/output circuit of an integrated circuit.

RELATED ART

Programmable logic devices (PLDs), such as field programmable gate arrays (FPGAs), typically include input/output blocks (IOBs) for providing and receiving external data. An IOB will therefore include an output driver circuit. FIG. 1 is a block diagram of a conventional output driver circuit 100, which includes an input terminal 101, an output terminal 102, p-channel transistors $103_1$–$103_N$, n-channel transistors $104_1$–$104_N$ and I/O pad 105. Input terminal 101 is coupled to the gates of transistors $103_1$–$103_N$ and to the gates of transistors $104_1$–$104_N$. The source terminals of p-channel transistors $103_1$–$103_N$ are coupled to a $V_{CC}$ supply voltage terminal, and the source terminals of n-channel transistors $104_1$–$104_N$ are coupled to a ground terminal. The drain terminals of transistors $103_1$–$103_N$ and $104_1$–$104_N$ are coupled to I/O pad 105 through output terminal 102.

When a logic low signal is applied to input terminal 101, p-channel transistors $103_1$–$103_N$ are all turned on, thereby coupling I/O pad 105 to the $V_{CC}$ supply voltage terminal. In this condition, driver circuit 100 presents a predetermined resistance to I/O pad 105. This resistance is determined by the on-resistances of transistors $103_1$–$103_N$, taken in parallel.

Similarly, when a logic high signal is applied to input terminal 101, n-channel transistors $104_1$–$104_N$ are all turned on, thereby coupling I/O pad 105 to the ground terminal. In this condition, driver circuit 100 presents a predetermined resistance to I/O pad 105. This resistance is determined by the on-resistances of transistors $104_1$–$104_N$, taken in parallel.

In certain circumstances, it is desirable for the resistance presented to I/O pad 105 to have a predetermined relationship with an external resistance coupled to I/O pad 105. For example, it may be desirable for the resistance presented to I/O pad 105 to match an impedance of a trace or wire coupled to I/O pad 105 to improve signal integrity.

Unfortunately, the resistance presented by output driver circuit 100 is fixed at a predetermined value, thereby preventing the driver circuit from being optimized for different trace or wire impedances. Thus, the operating flexibility of driver circuit 100 is limited. In addition, the predetermined resistance value of output driver circuit 100 will vary in response to temperature, voltage and/or process variations. Thus, even if the predetermined resistance of output driver circuit 100 initially has a desirable relationship with a trace or wire impedance coupled to I/O pad 105, this relationship may shift as the resistance of output driver circuit 100 changes in response to changes in temperature, voltage or process.

It would therefore be desirable to have an output driver circuit which overcomes the deficiencies of the above described driver circuit 100.

SUMMARY

Accordingly, the present invention provides a system for controlling the impedances of output driver circuits on an integrated circuit chip. At least one output driver circuit is selected to operate as a p-channel reference circuit, and at least one output driver circuit is selected to operate as an n-channel reference circuit. Other output driver circuits are selected to operate as active output driver circuits and/or line termination circuits.

In one embodiment, the p-channel reference circuit includes a first set of p-channel transistors coupled in parallel between a $V_{CC}$ supply terminal and a first pad, and a p-channel reference resistor $R_{PREF}$ coupled between the first pad and a ground supply terminal. A control circuit determines which subset of transistors in the first set of p-channel transistors should be turned on to provide a pre-determined correspondence with the reference resistor $R_{PREF}$. For example, the control circuit may determine which subset of transistors in the first set of p-channel transistors should be turned on to match the resistance of reference resistor $R_{PREF}$. To make this determination, a first reference voltage generator provides a p-channel reference voltage $V_{PREF}$ to a first comparator. The first comparator compares the p-channel reference voltage $V_{PREF}$ with the voltage on the first pad. In response, the first comparator generates a control signal, which indicates whether the resistance of turned on transistors in the first set of p-channel transistors has a determined relationship with respect to the p-channel reference resistor $R_{PREF}$ and the p-channel reference voltage $V_{PREF}$. The control circuit adjusts the subset of turned on p-channel transistors until the desired correspondence is provided.

The control circuit then addresses a selected group of one or more of the active output driver circuits, and transmits information identifying the determined subset of turned on p-channel transistors. This selected group of active output driver circuits will then turn on transistors corresponding to the determined subset of p-channel transistors to drive a logic high output signal, or provide a desired line termination.

In one embodiment, the control circuit dynamically updates the determined subset of p-channel transistors during operation of the chip, thereby compensating for variations in temperature, voltage and process.

In another embodiment, the first reference voltage generator is configured to provide a plurality of different p-channel reference voltages $V_{PREF}$. The control circuit then determines different subsets of turned on p-channel transistors for each of the different p-channel reference voltages. The control circuit then addresses different groups of active output driver circuits, with each of the different groups being configured to enable different subsets of p-channel transistors, as determined by the control circuit.

In one embodiment, the first set of p-channel transistors includes fine adjustment p-channel transistors having the same resistance, and coarse adjustment p-channel transistors having binary weighted resistances.

The n-channel reference circuit is configured and controlled in a manner similar to p-channel reference circuit. More specifically, the n-channel reference circuit includes a first set of n-channel transistors coupled in parallel between a ground supply terminal and a second pad, and an n-channel reference resistor $R_{NREF}$ coupled between the second pad and the $V_{CC}$ supply terminal. A control circuit determines which subset of transistors in the first set of n-channel transistors should be turned on to provide a pre-determined correspondence with the reference resistor $R_{NREF}$. To make this determination, a second reference voltage generator provides an n-channel reference voltage $V_{NREF}$ to a second comparator. The second comparator compares the n-channel reference voltage $V_{NREF}$ with the voltage on the second pad. In response, the second comparator generates a control signal, which indicates whether the resistance of turned on transistors in the first set of n-channel transistors has a determined relationship with respect to the n-channel reference resistor $R_{NREF}$ and the n-channel reference voltage $V_{NREF}$. The control circuit adjusts the subset of turned on n-channel transistors until the desired correspondence is provided.

The control circuit then addresses a selected group of one or more of the active output driver circuits, and transmits information identifying the determined subset of turned on n-channel transistors. This selected group of active output driver circuits will then turn on transistors corresponding to the determined subset of n-channel transistors to drive a logic low output signal, or provide a desired line termination.

In general, the n-channel reference circuit can be controlled in the same manner as the p-channel reference circuit.

In a particular embodiment, the subset of p-channel transistors determined by the p-channel reference circuit is transmitted to the n-channel reference circuit. In response, the n-channel reference circuit turns on a corresponding subset of p-channel transistors to provide the n-channel reference resistance. This eliminates the need for two separate external reference resistors.

The present invention will be more fully understood in view of the following description and drawings.

DETAILED DESCRIPTION

Figure 1:
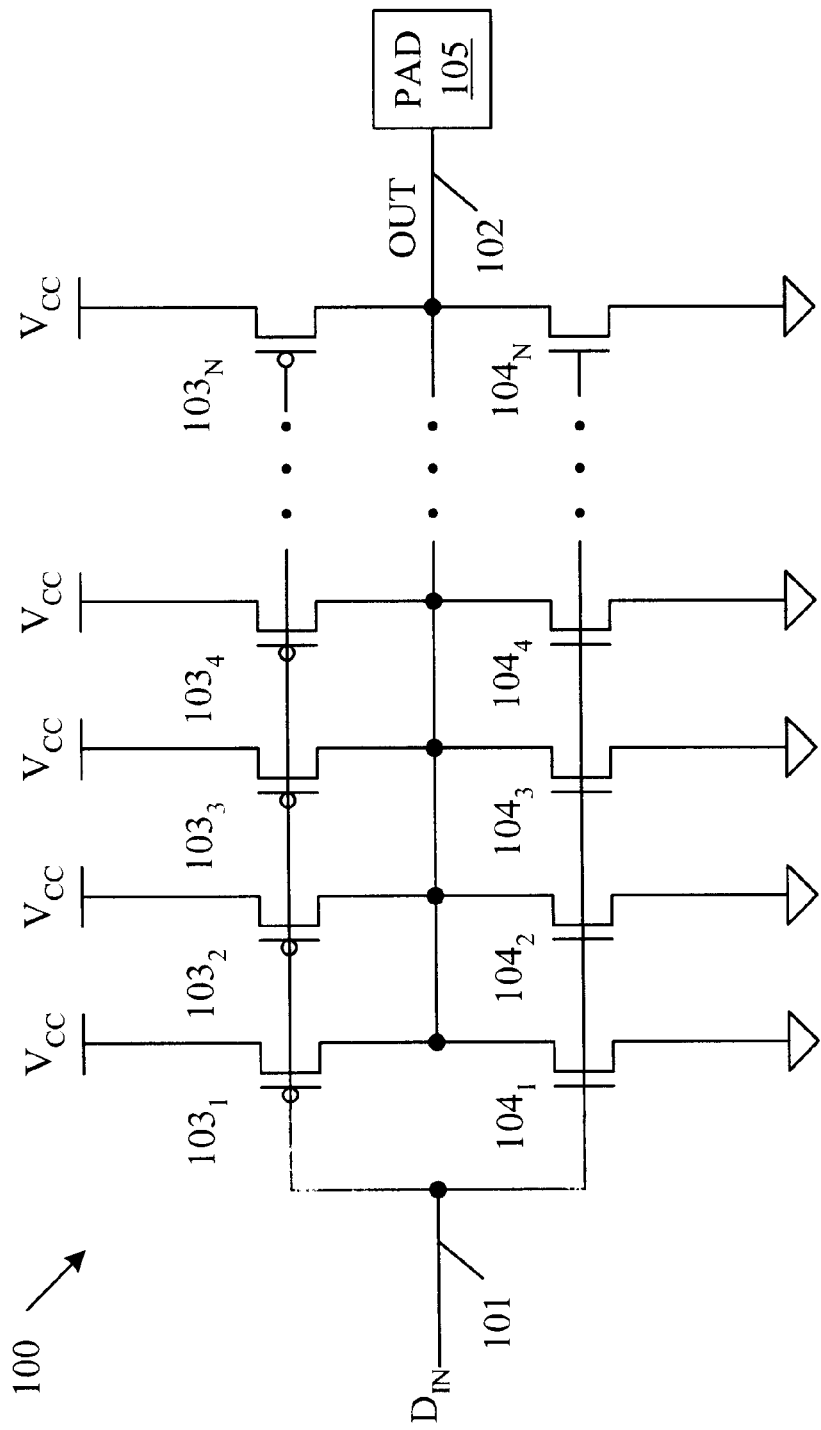
FIG. 1 is a circuit diagram of a conventional output driver circuit used in a programmable logic device.
Figure 2:
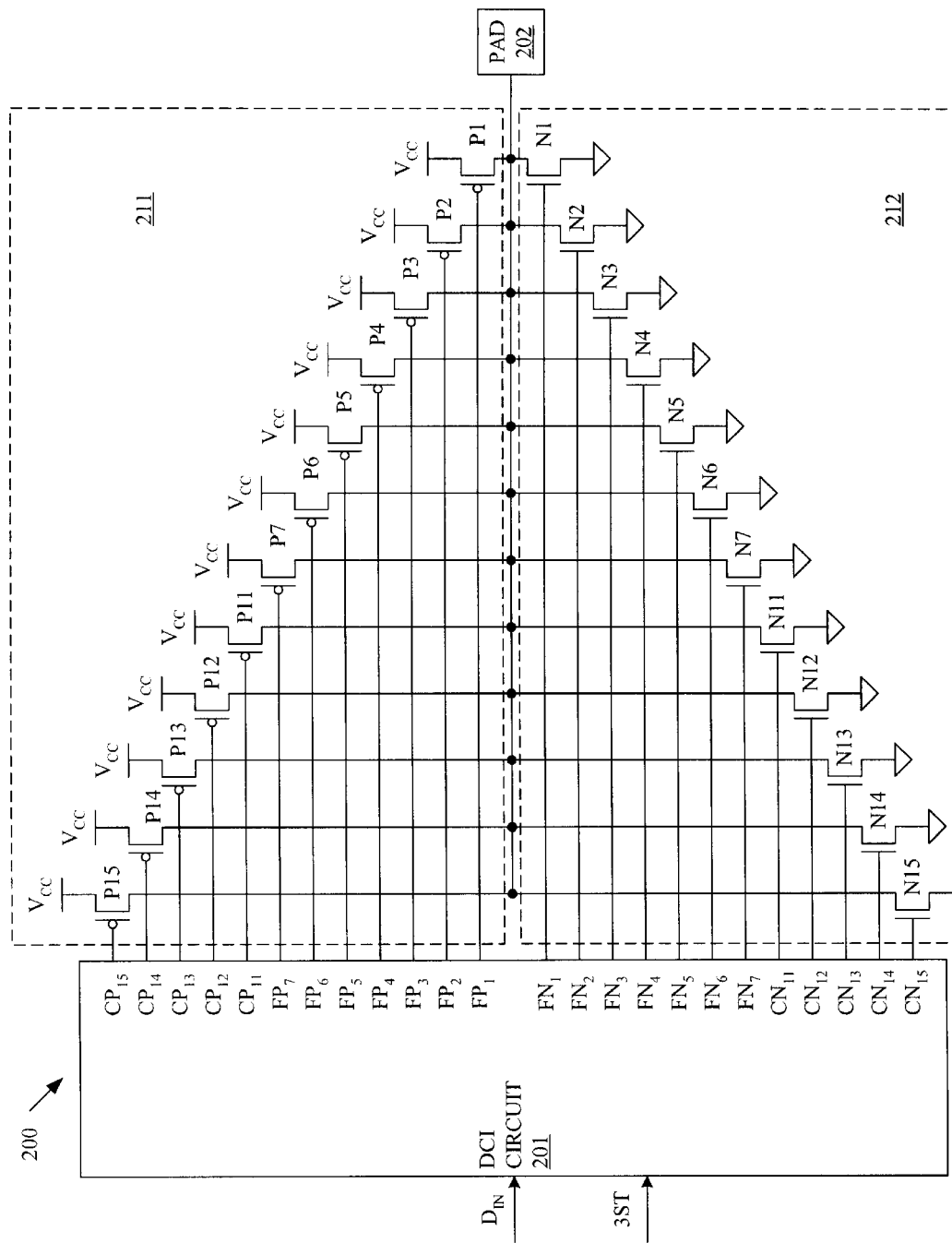
FIG. 2 is a circuit diagram of an output driver circuit in accordance with one embodiment of the invention.

FIG. 2 is a circuit diagram of an output driver 200 in accordance with one embodiment of the present invention. Output driver 200 includes digitally controlled impedance (DCI) circuit 201, p-channel pull-up transistors P1–P7 and P11–P15, n-channel pull-down transistors N1–N7 and N11–N15, and I/O pad 202. P-channel pull-up transistors P1–P7 and P11–P15 are collectively referred to as p-channel transistors 211, and n-channel pull-down transistors N1–N7 and N11–N15 are collectively referred to as n-channel transistors 212. In other embodiments, other combinations of transistors can be used.

As described in more detail below, p-channel transistors P1–P7 are used as "fine-adjustment" transistors, each having an on-conductance of "$Y_P$" siemens. Similarly, n-channel transistors N1–N7 are used as "fine-adjustment" transistors, each having an on-conductance of "$Y_N$" siemens. P-channel transistors P11–P15 are used as "coarse-adjustment" transistors, having on-conductances of $1X_P$, $2X_P$, $4X_P$, $8X_P$ and $16X_P$ siemens, respectively. N-channel transistors N11–N15 are also used as "coarse-adjustment" transistors, having on-conductances of $1X_N$, $2X_N$, $4X_N$, $8X_N$ and $16X_N$ siemens, respectively. In the described embodiment, $Y_P$ is approximately equal to $X_P$, and $Y_N$ is approximately equal to $X_N/2$. In other embodiments, other conductance values can be used.

Each of fine p-channel transistors P1–P7 and coarse p-channel transistors P11–P15 has a source coupled to a $V_{CC}$ voltage supply terminal. Each of fine n-channel transistors N1–N7 and coarse n-channel transistors N11–N15 has a source coupled to a ground voltage supply terminal. The drains of transistors P1–P7, P11–P15, N1–N7 and N11–N15 are coupled to I/O pad 202.

The gates of fine p-channel transistors P1–P7 are coupled to receive control signals $FP_1$–$FP_7$, respectively, from DCI circuit 201. Similarly, the gates of coarse p-channel transistors P11–P15 are coupled to receive control signals $CP_{11}$–$CP_{15}$, respectively, from DCI circuit 201.

The gates of fine n-channel transistors N1–N7 are coupled to receive control signals $FN_1$–$FN_7$, respectively, from DCI circuit 201. Similarly, the gates of coarse n-channel transistors N11–N15 are coupled to receive control signals $CN_{11}$–$CN_{15}$, respectively, from DCI circuit 201.

DCI circuit 201 is configured to receive a data input signal $D_{IN}$ and a tri-state signal 3ST, each having a logic high or logic low value. These signals are provided by user circuits external to output driver 200. In general, if 3ST signal has a logic low value (i.e., driver 200 is not tri-stated) and the $D_{IN}$ signal has a logic low value, DCI circuit 201 asserts one or more of the control signals $FP_1$–$FP_7$, $CP_{11}$–$CP_{15}$ to a logic low value, thereby turning on one or more of p-channel transistors P1–P7, P11–P15. The turned on p-channel transistors are selected in a manner described in more detail below. DCI circuit 201 also provides logic low control signals $FN_1$–$FN_7$, $CN_{11}$–$CN_{15}$, thereby turning off all of n-channel transistors N1–N7 and N11–N15. As a result, pad 202 is coupled to the $V_{CC}$ voltage supply terminal through the turned-on p-channel transistors. DCI circuit 201 selects the turned-on p-channel transistors to provide a particular resistance between the $V_{CC}$ voltage supply terminal and pad 202.

If the 3ST signal has a logic high value, then output driver circuit 200 is tri-stated and will generally not drive pad 202. However, if output driver circuit 200 is used to provide a transmission line termination (as described in more detail below), then output driver circuit 200 will be configured to turn on a combination of n-channel and/or p-channel transistors to provide the appropriate transmission line termination resistance. In this case, the 3ST signal has no affect on the line termination.

In the examples described below, coarse p-channel transistors P11–P15 are enabled in a binary count order to provide a coarse resistance adjustment. Fine p-channel transistors P1–P7 are then enabled or disabled to provide a fine resistance adjustment. For example, fine p-channel transistors P1–P3 and coarse p-channel transistor P13 may be turned on when the $D_{IN}$ signal has a low value. In this example, the equivalent conductance of the p-channel portion of output driver circuit 200 would be equal to $X_P + X_P + X_P + 4X_P$, or $7X_P$ siemens.

If 3ST signal has a logic low value and the $D_{IN}$ signal has a logic high value, then DCI circuit 201 asserts one or more of the control signals $FN_1$–$FN_7$, $CN_{11}$–$CN_{15}$ to a logic high value, thereby turning on one or more of n-channel transistors N1–N7, N11–N15. The turned on n-channel transistors are selected in a manner described in more detail below. DCI circuit 201 also provides logic high control signals $FP_1$–$FP_7$, $CP_{11}$–$CP_{15}$, thereby turning off all of p-channel transistors P1–P7 and P11–P15. As a result, pad 202 is coupled to the ground terminal through the turned-on n-channel transistors. DCI circuit 201 selects the turned-on n-channel transistors to provide a particular resistance between the ground terminal and pad 202.

In the examples described below, the coarse n-channel transistors N11–N15 are turned on in a binary count order to provide a coarse resistance adjustment. Fine n-channel transistors N1–N7 are then enabled or disabled to provide a fine resistance adjustment. For example, fine n-channel transistors N1–N2 and coarse n-channel transistors N11 and N14 may be turned on when the $D_{IN}$ signal has a high value. In this example, the equivalent conductance of the n-channel portion of output driver circuit 200 would be equal to $X_N/2 + X_N/2 + X_N + 8X_N$, or $10X_N$ siemens.

A chip will include a plurality of output driver circuits identical to output driver circuit 200. In general, one output driver circuit is selected to be a p-channel reference circuit, which is used to determine which p-channel transistors must be turned on to provide a desired resistance for a logic high output value or a desired transmission line termination. Similarly, one output driver circuit is selected to be an n-channel reference circuit, which is used to determine which n-channel transistors must be turned on to provide a desired resistance for a logic low output value or a desired transmission line termination. The determinations made by the p-channel and n-channel reference circuits are then transmitted to, and used by, other active output driver circuits.

Figure 3A:
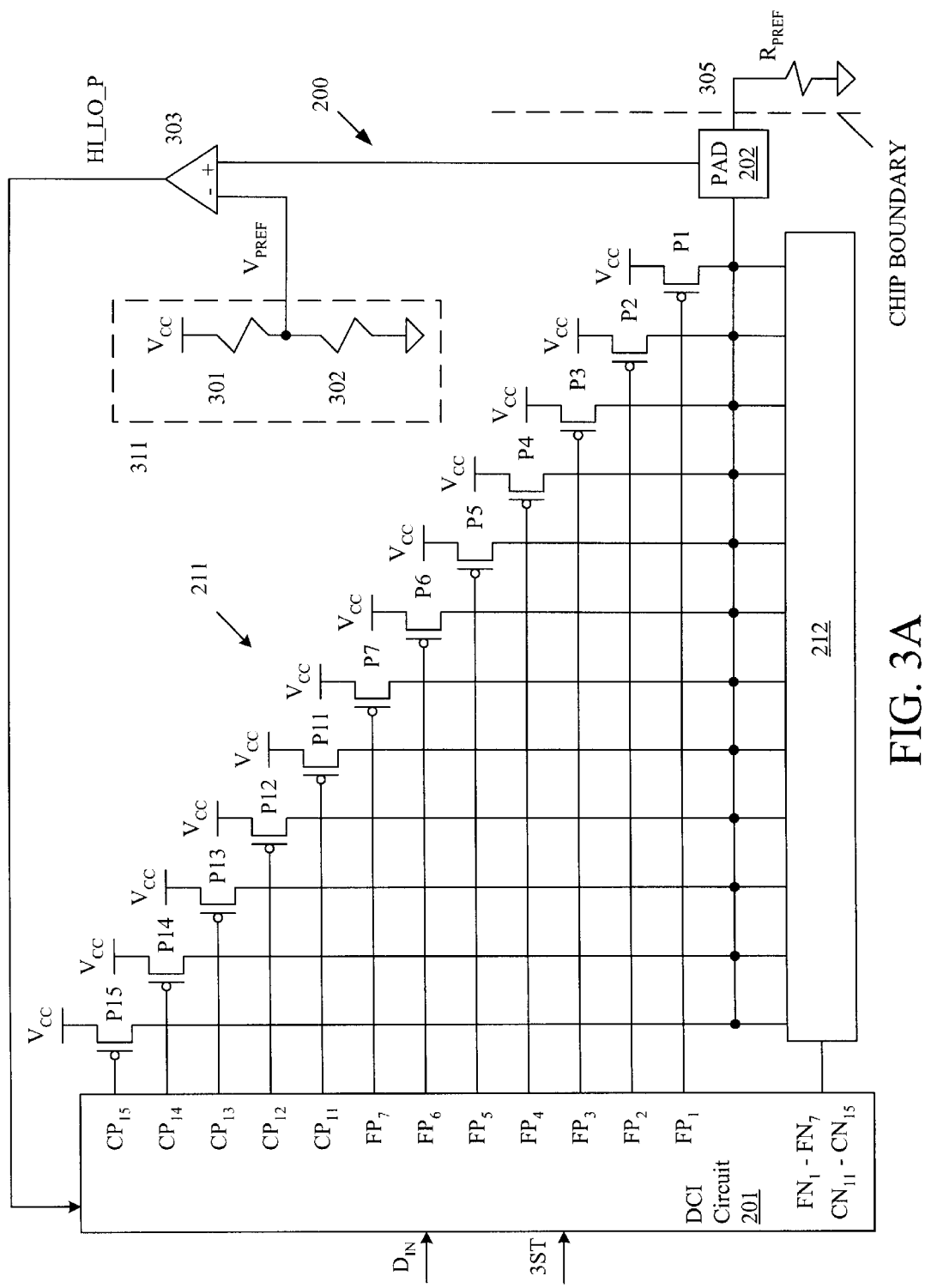
FIG. 3A is a circuit diagram illustrating the general manner in which p-channel transistors of an output driver circuit are matched with an external resistance in accordance with one embodiment of the present invention.

FIG. 3A is a circuit diagram illustrating the general manner in which p-channel transistors P1–P7 and P11–P15 of output driver circuit 200 are controlled with respect to an external resistance 305 in accordance with one embodiment of the present invention. That is, FIG. 3A illustrates output driver circuit 200 being used as a p-channel reference circuit. As shown in FIG. 3A, external resistor 305, having a resistance of $R_{PREF}$, is coupled between pad 202 and ground. Internally, pad 202 is also coupled to a positive input terminal of comparator 303. The negative input terminal of comparator 303 is coupled to receive a p-channel reference voltage $V_{PREF}$ from a reference voltage generator 311. In the described example, reference voltage generator 311 includes a pair of resistors 301–302 connected in series between the $V_{CC}$ voltage supply and the ground supply. Resistors 301–302 are connected at a common node, which provides the $V_{PREF}$ voltage. In the described example, resistors 301–302 each have a resistance of R ohms. As a result, the reference voltage $V_{PREF}$ has a value of approximately $V_{CC}/2$. The voltage on pad 202 will exhibit a voltage of approximately $V_{CC}/2$ when the equivalent on-resistance of the enabled p-channel transistors 211 is approximately equal to the resistance $R_{PREF}$ of reference resistor 305. In other examples, other resistance values and ratios can be used for resistors 301 and 302.

DCI circuit 201 operates as follows. Initially, all of the p-channel transistors P1–P7 and P11–P15 are turned off. As a result, the voltage on pad 202 is pulled down to a voltage less than the reference voltage $V_{PREF}$. As a result, comparator 303 provides a logic low HI_LO_P output signal.

DCI circuit 201 then asserts logic low control signals $FP_1$–$FP_3$, thereby turning on fine p-channel transistors P1–P3 ($3X_P$ siemens). If the equivalent resistance of fine p-channel transistors P1–P3 is greater than the resistance $R_{PREF}$, then the voltage on pad 202 will be less than the reference voltage $V_{PREF}$. As a result, comparator 303 will provide a logic low HI_LO_P output signal.

In response, DCI circuit 201 asserts a logic low control signal $CP_{11}$, thereby turning on coarse p-channel transistor P1–P3 ($3X_P$ siemens). If the equivalent resistance of fine p-channel transistors P1–P3 is greater than the resistance $R_{PREF}$, then the voltage on pad 202 will be less than the reference voltage $V_{PREF}$. As a result, comparator 303 will provide a logic low HI_LO_P output signal.

In response, DCI circuit 201 asserts a logic low control signal $CP_{11}$, thereby turning on coarse p-channel transistor $P_{11}$ ($X_P$ siemens) (along with fine p-channel transistors P1–P3). transistors P1–P3).

Note that fine p-channel transistors P1–P7 are set near the midpoint of their range by initially turning on three of these transistors P1–P3 while the coarse p-channel transistors are selected. This enables the fine p-channel transistors P1–P7 to maintain an appropriate operating range when the resistance needs to be increased or decreased.

If the equivalent resistance of fine p-channel transistors P1–P3 and coarse p-channel transistor P11 is still greater than the resistance $R_{PREF}$, then the voltage on pad 202 will still be less than the reference voltage $V_{PREF}$. As a result, comparator 303 will again provide a logic low HI_LO_P output signal. In response, DCI circuit 201 de-asserts coarse control signal $CP_{11}$ (high), and asserts coarse control signal $CP_{12}$ (low), thereby turning on coarse p-channel transistor P12 ($2X_P$ siemens) (along with fine p-channel transistors P1–P3).

If the equivalent resistance of fine p-channel transistors P1–P3 and coarse p-channel transistor P12 is still greater than the resistance $R_{PREF}$, then the voltage on pad 202 will still be less than the reference voltage $V_{PREF}$. As a result, comparator 303 will again provide a logic low HI_LO_P output signal. In response, DCI circuit 201 asserts both coarse control signals $CP_{11}$ and $CP_{12}$ (low), thereby turning on coarse p-channel transistors P11–P12 ($3X_P$ siemens) (along with fine p-channel transistors P1–P3).

This sequence continues, with coarse p-channel transistors P11–P15 being turned on in a binary count order (e.g., $1X_P$, $2X_P$, $3X_P$, $4X_P$, $5X_P$, $6X_P$ . . . ) until the equivalent resistance of fine p-channel transistors P1–P3 and the enabled coarse p-channel transistors is less than the reference resistance $R_{PREF}$. At this time, the voltage on pad 202 will be greater than reference voltage $V_{PREF}$, thereby providing a logic high HI_LO_P signal. In response, DCI circuit 201 returns the coarse p-channel transistors to the binary count prior to the binary count that caused the HI_LO_P signal to go high.

For example, if the equivalent resistance of fine p-channel transistors P1–P3 and coarse p-channel transistors P12 and P13 ($6X_P$) is less than reference resistance $R_{PREF}$, then a logic high HI_LO_P signal will be generated. In response, DCI circuit 201 de-asserts control signal $CP_{12}$ (high), thereby turning off coarse p-channel transistor P12. DCI circuit 201 also asserts a logic low control signals $CP_{11}$ and $CP_{13}$, thereby turning on coarse p-channel transistors P11 and P13 ($5X_P$). Coarse p-channel transistors P11 and P13 are thereby selected to be the only turned-on coarse p-channel transistors for the duration of the present operating scheme. All further adjustments in the on-resistance of p-channel transistors 211 are made by enabling and disabling fine p-channel transistors P1–P7.

After the coarse adjustment described above, if coarse p-channel transistors P11 and P13 and fine p-channel transistors P1-P3 present an equivalent resistance that is greater than reference resistance $R_{PREF}$, comparator 303 again provides a logic low HI_LO_P signal to DCI circuit 201. Because the coarse transistors P11 and P13 have been set, DCI circuit 201 will only adjust the fine p-channel transistors at this time. Thus, DCI circuit 201 asserts the $FP_4$ control signal (in addition to the $FP_1$–$FP_3$, $CP_{11}$ and $CP_{13}$ signals), thereby turning on fine p-channel transistor P4 (in addition to fine p-channel transistors P1-P3 and coarse p-channel transistors P11 and P13). If the equivalent resistance of p-channel transistors P1–P4, P11 and P13 is less than reference resistance $R_{PREF}$, then comparator 303 will provide a high HI_LO_P signal. In response, DCI circuit 201 will subsequently turn off fine p-channel transistor P4.

If the equivalent resistance of fine p-channel transistors P1–P4 and coarse p-channel transistors P11 and P13 is greater than reference resistance $R_{REF}$, then comparator 303 will again provide a low HI_LO_P output signal. In response, DCI circuit 201 will assert the $FP_5$ signal (in addition to the $FP_1$–$FP_4$, $CP_{11}$ and $CP_{13}$ signals), thereby turning on fine p-channel transistor P5 (in addition to fine p-channel transistors P1–P4 and coarse p-channel transistors P11 and P13). If the equivalent resistance of p-channel transistors P1–P5, P11 and P13 is less than (or greater than) reference resistance $R_{PREF}$, then comparator 303 will provide a high (or low) HI_LO_P output signal. Operation continues in this manner, with the fine p-channel transistors being adjusted as required. As a result, the equivalent resistance of the turned on p-channel transistors will have a predetermined relationship with respect to the reference resistance $R_{PREF}$. Advantageously, the number of turned on p-channel transistors will be further modified in response to the operating conditions of the system (e.g., changes in temperature and/or voltage) to maintain the equivalent resistance.

As described in more detail below, information identifying the enabled transistors in the p-channel reference circuit (FIG. 3A) is transmitted to other output driver circuits, such that these other output driver circuits are operated by enabling the same transistors as the p-channel reference circuit.

Figure 3B:
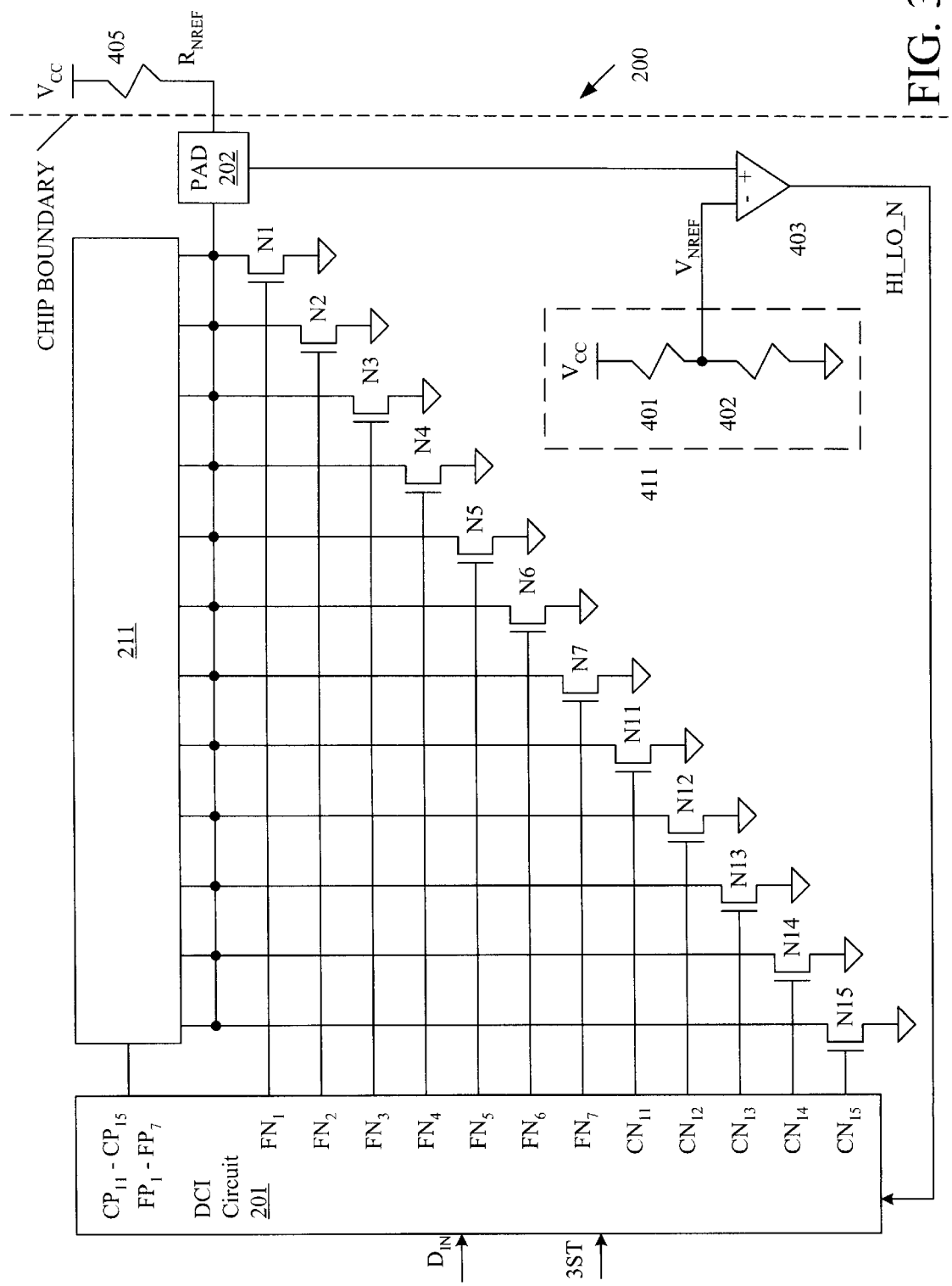
FIG. 3B is a circuit diagram illustrating the general manner in which n-channel transistors of an output driver circuit are matched with an external resistance in accordance with one embodiment of the present invention.

FIG. 3B is a circuit diagram illustrating the general manner in which n-channel transistors N1–N7 and N11–N15 of output driver circuit 200 are matched with an external resistance 405 in accordance with one embodiment of the present invention. That is, FIG. 3B illustrates output driver circuit 200 being used as an n-channel reference circuit. As shown in FIG. 3B, external resistor 405, having a resistance of REF, is coupled between pad 202 and the $V_{CC}$ supply terminal. Internally, pad 202 is also coupled to the positive input terminal of comparator 403. The negative input terminal of comparator 403 is coupled to receive a reference voltage $V_{NREF}$ from a reference voltage generator 411. In the described example, reference voltage generator 411 includes a pair of resistors 401–402 connected in series between the $V_{CC}$ supply terminal and the ground terminal. Resistors 401–402 are connected at a common node, which provides the $V_{NREF}$ voltage. In the described example, resistors 401–402 each have a resistance of R ohms. As a result, the reference voltage $V_{NREF}$ has a value of approximately $V_{CC}/2$. The voltage on pad 202 will exhibit a voltage of approximately $V_{CC}/2$ when the resistance provided by the turned on n-channel transistors is approximately equal to the resistance $R_{NREF}$ of reference resistor 405.

DCI circuit 201 selects the n-channel transistors to be enabled in the same manner that the p-channel transistors are selected, as described above in connection with FIG. 3A. Thus, all of the n-channel transistors N1–N7 and N11–N15 are initially turned off by DCI circuit 201. Fine n-channel transistors N1–N3 are then turned on by DCI circuit 201. If necessary, coarse n-channel transistors N11–N15 are turned on in a binary count order until comparator 403 provides a logic low HI_LO_N output signal. Upon detecting the logic low HI_LO_N output signal, DCI circuit 201 enables the coarse n-channel transistors corresponding with the previous binary count, and makes all further adjustments using the fine n-channel transistors N1–N7.

As described in more detail below, information identifying the enabled transistors in the n-channel reference circuit (FIG. 3B) is transmitted to other output driver circuits, such that these other output driver circuits are operated by enabling the same transistors as the n-channel reference circuit. As a result, the output driver circuits will be referenced to external reference resistances. This advantageously optimizes the operation of the output driver circuits.

In another embodiment, instead of the linear search algorithm described above, a binary search algorithm can be used to determine the P or N channel transistors to be turned on.

In accordance with one embodiment, adjustments made by DCI circuit 201 can be dynamically enabled or disabled. For example, after DCI circuit 201 has determined which coarse and fine p-channel transistors should be turned on, and which coarse and fine n-channel transistors should be turned on, DCI circuit 201 can be prevented from making further changes to the enabled/disabled transistors. Thus, if DCI circuit 201 initially determines that p-channel transistors P1–P3, P13 and P15 should be turned on, then further adjustments by DCI circuit 201 can be disabled, thereby causing this p-channel determination to be used, without change, until the DCI circuit 201 is re-enabled.

In the embodiment described above, both of the reference voltages $V_{PREF}$ and $V_{NREF}$ have a value of approximately $V_{CC}/2$, thereby causing the p-channel transistors to be referenced to reference resistance 305 ($R_{PREF}$) and the n-channel transistors to be referenced to reference resistance 405 ($R_{NREF}$). In another embodiment, the reference voltages $V_{PREF}$ and $V_{NREF}$ can be modified to have values of approximately $2V_{CC}/3$ and $V_{CC}/3$, respectively. This effectively references the p-channel transistors to ½ of the reference resistance 305 ($R_{PREF}$), and references the n-channel transistors to ½ of the reference resistance 405 ($R_{NREF}$). In other embodiments, the reference voltages $V_{PREF}$ and $V_{NREF}$ can be modified to have other values, such that the turned on transistors will have different relationships with respect to the reference resistors 305 and 405. This advantageously allows reference resistors having different values to be used.

In another embodiment, external reference resistor 405 can be eliminated. In this embodiment, the reference resistance for the n-channel reference circuit is provided by turning on the p-channel transistors 211 determined by the p-channel reference circuit in response to reference resistor 305. Thus, if the p-channel reference circuit determines that coarse p-channel transistors P13 and P15 and fine p-channel transistors P1–P4 must be turned on to provide the desired correspondence with reference resistor 305, then these transistors P1–P4, P13 and P15 are turned on in the n-channel reference circuit. The n-channel reference circuit then determines which n-channel transistors 212 should be turned on to correspond with the turned on p-channel transistors in the output driver circuit. In this manner, the n-channel transistors 212 turned on by the n-channel reference circuit are indirectly referenced to the external reference resistance $R_{PREF}$ 305.

In a similar manner, external reference resistor 305 can be eliminated. In this embodiment, the n-channel reference circuit determines which n-channel transistors should be turned on in response to the external reference resistance 405 ($R_{NREF}$). This information is then transmitted to the p-channel reference circuit, such that the same n-channel transistors are turned on in the p-channel reference circuit. The p-channel reference circuit then determines which p-channel transistors should be turned on to correspond with the turned on n-channel transistors. In this manner, the p-channel transistors turned on by the p-channel reference circuit are indirectly referenced to the external reference resistance 405.

In another embodiment, output driver 200 of FIGS. 2, 3A and 3B can be used in the IOBs of a FPGA. A specific implementation involving a plurality of output drivers and a plurality of IOBs will be described below in connection with FIG. 8.

Figure 4:
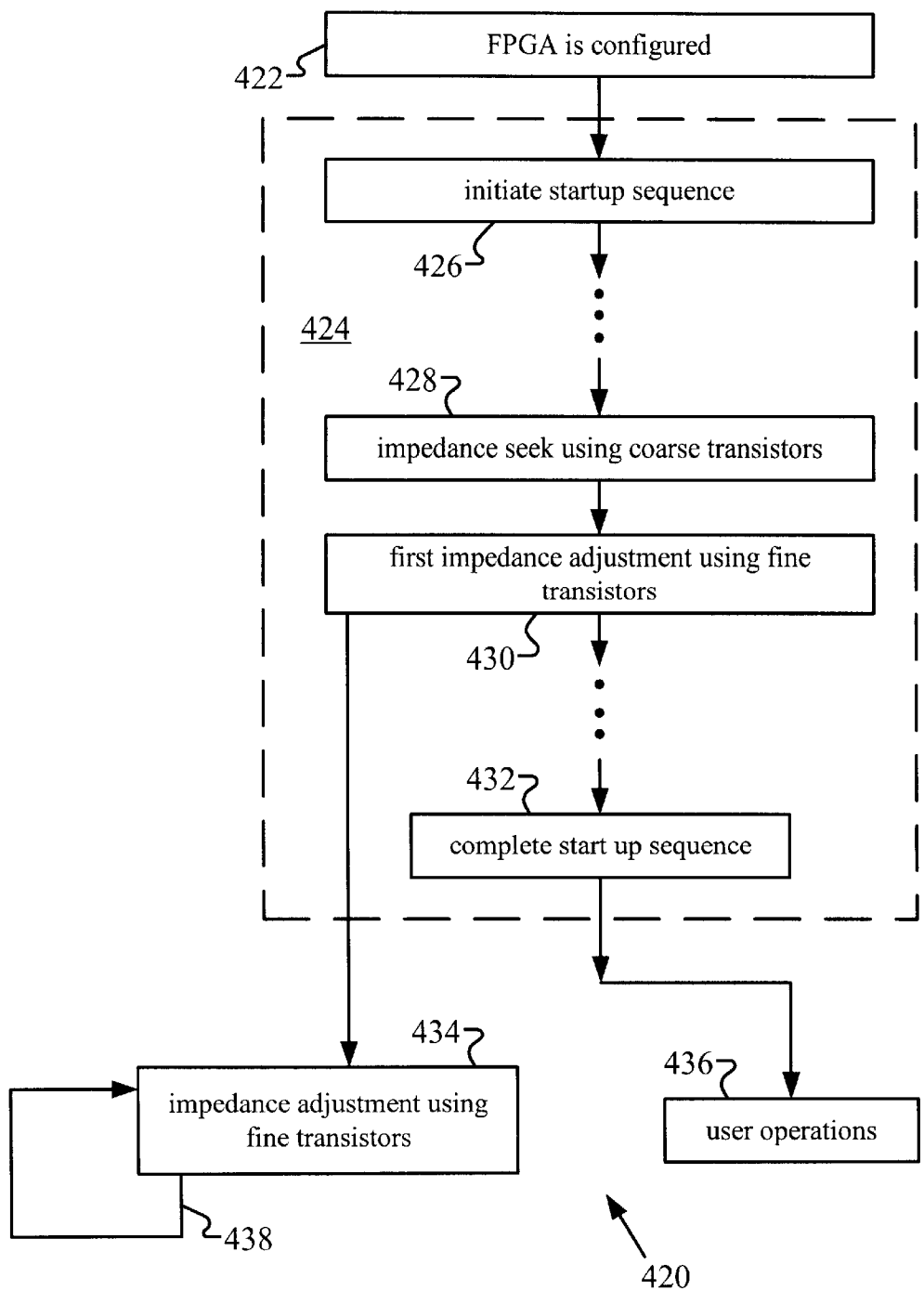
FIG. 4 is a flow chart showing an operation of the present invention.

FIG. 4 is a flow chart for a process 420 that can be used to accurately match the impedance of output driver 200 to a value related to an external resistor. In step 422, the FPGA is configured in a conventional manner. The FPGA then performs a startup sequence 424. In step 426, the startup sequence of the FPGA is initialized. Among the tasks in the startup sequence are steps 428 and 430. In step 428, an impedance seek procedure is performed using only the coarse transistors of output driver 200. The procedure has been described in detail above in connection with FIGS. 3A and 3B. In step 430, an impedance adjustment procedure is performed using only the fine transistors. The procedure has been described in detail above in connection with FIGS. 3A and 3B. Note that step 430 is performed even after the startup sequence. Thus, in FIG. 4, this step is shown partly inside startup sequence 424 and partly outside. The startup sequence 424 terminates at a step 432.

After the startup sequence, the FPGA will perform its intended user operation (step 436) and continue to adjust impedance using the fine transistors (434). The flow chart in FIG. 4 shows a continuous loop 438 to illustrate this activity.

Figure 5A:
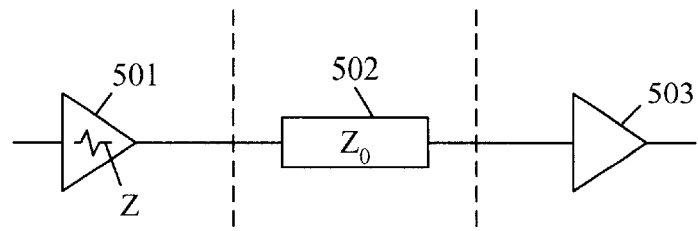
FIG. 5A is a circuit diagram illustrating a DCI output driver circuit 501 that has a digitally controlled impedance Z.

As described above, adjusting the p-channel and n-channel transistors to be enabled in an output driver circuit in response to reference resistances advantageously enables the output driver circuit to exhibit a particular resistance with respect to reference resistors. An output driver circuit that is adjusted in this manner will be referred to as a digitally controlled impedance (DCI) output driver circuit. FIG. 5A is a circuit diagram illustrating a DCI output driver circuit 501 that has a digitally controlled impedance Z. Impedance Z is selected to correspond with the impedance $Z_0$ of a line 502 located between the DCI driver circuit 501 and a receiver circuit 503.

Figure 5B:
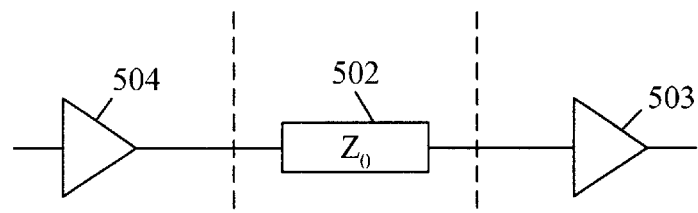
FIG. 5B is a circuit diagram illustrating an output driver circuit 504 in which DCI circuit 201 has been bypassed.

In another embodiment, DCI circuit 201 is bypassed, such that some or all of the p-channel transistors 211 are turned on to provide a logic high output signal, and some or all of the n-channel transistors 212 are turned on to provide a logic low output signal. FIG. 5B is a circuit diagram illustrating an output driver circuit 504 in which DCI circuit 201 has been bypassed. Although output driver circuit 504 will exhibit an impedance, this impedance is not controlled to have a particular correspondence with the impedance $Z_0$ of line 502.

DCI circuit 201 can also be controlled to turn on user-selected p-channel transistors to provide a logic high output signal, and to turn on user-selected n-channel transistors to provide a logic low output signal. For example, DCI circuit 201 can be controlled to turn on only the coarse p-channel transistors P11–P15 to provide a logic high output signal, and to turn on only the coarse n-channel transistors N11–N15 to provide a logic low output signal, regardless of the external impedance $Z_0$. This alternative is described in more detail in commonly owned, co-pending U.S. Pat. No. 5,887,632, which is hereby incorporated by reference.

Figure 6A:
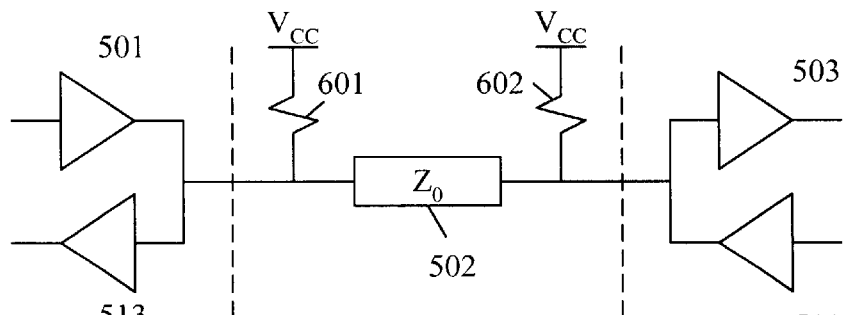
FIG. 6A is a circuit diagram illustrating external termination resistors, which are coupled between the ends of a line and a $V_{CC}$ supply voltage terminal.

In addition to controlling the turned on transistors of output driver circuit 200 to correspond with an external impedance $Z_0$, DCI circuit 201 can be controlled to provide a transmission line termination resistance. As illustrated in FIG. 6A, it is common to provide external termination resistors 601–602, which are coupled between the ends of line 502 and a $V_{CC}$ supply voltage terminal. In FIG. 6A, output driver circuit 501 is coupled to an input buffer 513 at one end of line 502, thereby providing an input/output I/O configuration. Similarly, input buffer 503 is coupled to output driver circuit 511 at the other end of line 502.

Figure 6B:
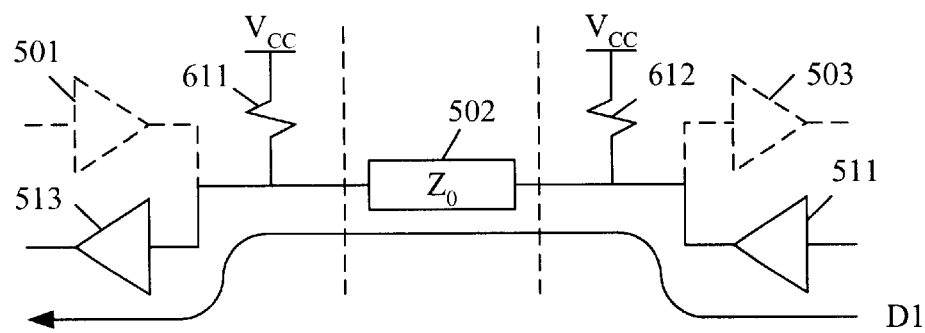
FIGS. 6B–6C are circuit diagrams illustrating termination resistors that are implemented using the digitally controlled impedances of output driver circuits, thereby eliminating the need for external termination resistors.
Figure 6C:
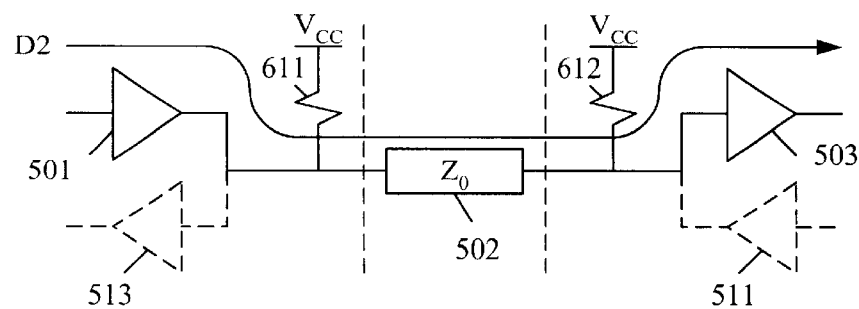

As illustrated in FIGS. 6B and 6C, termination resistors 611 and 612 can be implemented using the digitally controlled impedance of output driver circuits 501 and 511, respectively, thereby eliminating the need for external termination resistors 601 and 602. To determine the p-channel transistors to be turned on to implement termination resistors 611 and 612, the DCI circuits in output driver circuits 501 and 511 are referenced to a known resistance in response to reference voltages $V_{PREF}$ and $V_{NREF}$ having values of approximately $V_{CC}/2$ and $V_{CC}/2$, respectively. Advantageously, the termination resistance is controlled with respect to external reference resistors and can be adjusted for changes in temperature, voltage and/or process.

Within output driver circuits 501 and 511, a user-selected set of p-channel transistors is used to drive a logic high output signal. For example, the coarse p-channel transistors P11-P15 may be selected to drive a logic high output signal in response to a corresponding input data signal. In this example, a subset of the fine p-channel transistors P1–P7 is selected to provide the termination resistance. While the coarse p-channel transistors are only turned on to drive a logic high output signal, the selected subset of the fine p-channel transistors P1–P7 are turned on at all times to provide the desired termination resistance. In other embodiments, other combinations of coarse and fine transistors can be used to serve as the user-selected transistors and the termination transistors.

FIG. 6B illustrates a signal D1 being driven from output driver 511 to input buffer 513. At this time, output driver 511 is configured in manner described above. That is, output driver 511 provides logic high and low output signals by turning on user-selected transistors (e.g., all coarse p-channel transistors or all coarse n-channel transistors). In addition, a second set of p-channel transistors in driver circuit 511 are turned on to implement termination resistor 612. A tri-state signal applied to output driver circuit 501 is asserted, such that this output driver circuit 501 is not responsive to signals applied to its input terminal. However, the set of p-channel transistors in output driver circuit 501 that have been selected to implement termination resistor 611 remain turned on. As a result, the desired termination resistances 611 and 612 are provided between line 502 and the $V_{CC}$ supply terminal.

FIG. 6C illustrates a signal D2 being driven from output driver 501 to input buffer 503. At this time, output driver 501 is configured in the same manner as output driver circuit 511 of FIG. 6B, such that this output driver 501 provides logic high and low output signals by turning on user-selected transistors, and provides the termination resistor 611 by turning on the set of p-channel transistors that have been selected to implement this termination resistor. A tri-state signal applied to output driver circuit 511 is asserted, such that this output driver circuit 511 is not responsive to signals applied to its input terminal. However, the set of p-channel transistors in output driver circuit 511 that have been selected to implement termination resistor 612 remain turned on. As a result, the desired termination resistances 611 and 612 are provided between line 502 and the $V_{CC}$ supply terminal. In this manner, output driver circuits 501 and 511 provide termination resistances 611 and 612, respectively, for bi-directional signal transfer on line 502. The terminations illustrated in FIGS. 6B–6C are referred to as single terminations, because a single set of transistors is used to provide each termination.

Figure 7A:
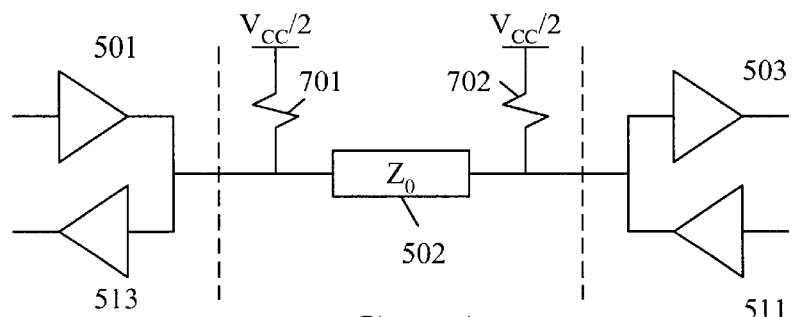
FIG. 7A is a circuit diagram illustrating external termination resistors, which are coupled between the ends of a line and a $V_{CC}/2$ supply voltage terminal.

As illustrated in FIG. 7A, it is also common to provide external termination resistors 701 and 702, which are coupled between the ends of line 502 and a $V_{CC}/2$ supply voltage terminal.

Figure 7B:
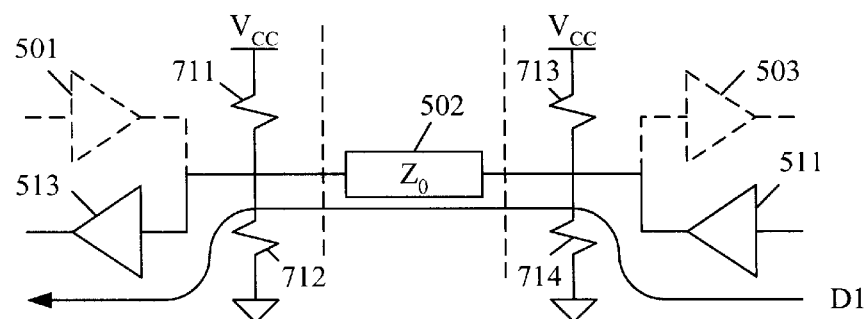
FIGS. 7B–7C are circuit diagrams of termination resistors that are implemented using the digitally controlled impedances of output driver circuits, thereby eliminating the need for external termination resistors and a $V_{CC}/2$ supply.
Figure 7C:
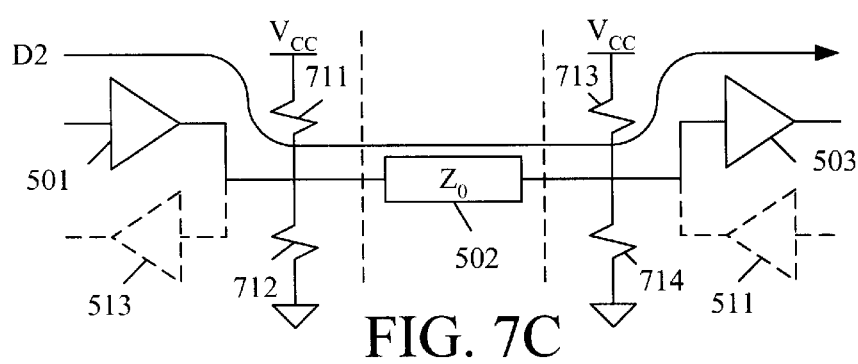

As illustrated in FIGS. 7B and 7C, termination resistors 711–712 and 713–714 can be implemented using the DCI circuits of driver circuits 501 and 511, respectively, thereby eliminating the need for external termination resistors 701 and 702 and the $V_{CC}/2$ power supply. Each of resistors 711–714 is determined to have a resistance that is equal to twice the resistance of resistor 701 (or 702). As a result, resistors 711–712 and 713–714 are the Thevenin equivalents of resistors 701 and 702, respectively.

To determine the p-channel and n-channel transistors to be turned on to implement termination resistors 711–714, the DCI circuits in output driver circuits 501 and 511 are referenced to known resistances in response to reference voltages $V_{PREF}$ and $V_{NREF}$ having values of approximately $2V_{CC}/5$ and $3V_{CC}/5$, respectively. Advantageously, impedance is controlled with respect to external reference resistors and can be adjusted for changes in temperature, voltage and/or process.

FIG. 7B illustrates a signal D1 being driven from output driver 511 to input buffer 513. At this time, output driver 511 is configured in the same manner as output driver circuit 511 of FIG. 6B, such that this output driver 511 provides logic high and low output signals by turning on user-selected transistors, and provides termination resistances 713 and 714 by turning on the p-channel and n-channel transistors that have been determined to provide these desired termination resistances 713 and 714. A tri-state signal applied to output driver circuit 501 is asserted, such that this output driver circuit 501 is not responsive to signals applied to its input terminal. However, the p-channel transistors and the n-channel transistors that have been determined to provide the desired termination resistances 711 and 712 remain turned on in output driver 501. As a result, output driver circuit 501 provides the equivalent of termination resistance 701 coupled between line 502 and a $V_{CC}/2$ supply terminal. Similarly, output driver circuit 511 provides the equivalent of termination resistance 702 between line 502 and a $V_{CC}/2$ supply terminal.

FIG. 7C illustrates a signal D2 being driven from output driver 501 to input buffer 503. At this time, output driver 501 is configured in the same manner as output driver circuit 511 of FIG. 7B, and output driver 511 is configured in the same manner as output driver circuit 501 of FIG. 7B. In this manner, output driver circuits 501 and 511 provide termination resistances 711–712 and 713–714, respectively, for bi-directional signal transfer on line 502.

The terminations illustrated in FIGS. 7B–7C are referred to as split terminations, because two sets of transistors are required to provide each termination.

The variations illustrated in FIGS. 5A–5B, 6A–6C and 7A–7C, as well as the manner of transmitting information from the p-channel and n-channel reference circuits to other output driver circuits, will now be described in more detail.

Figure 8:
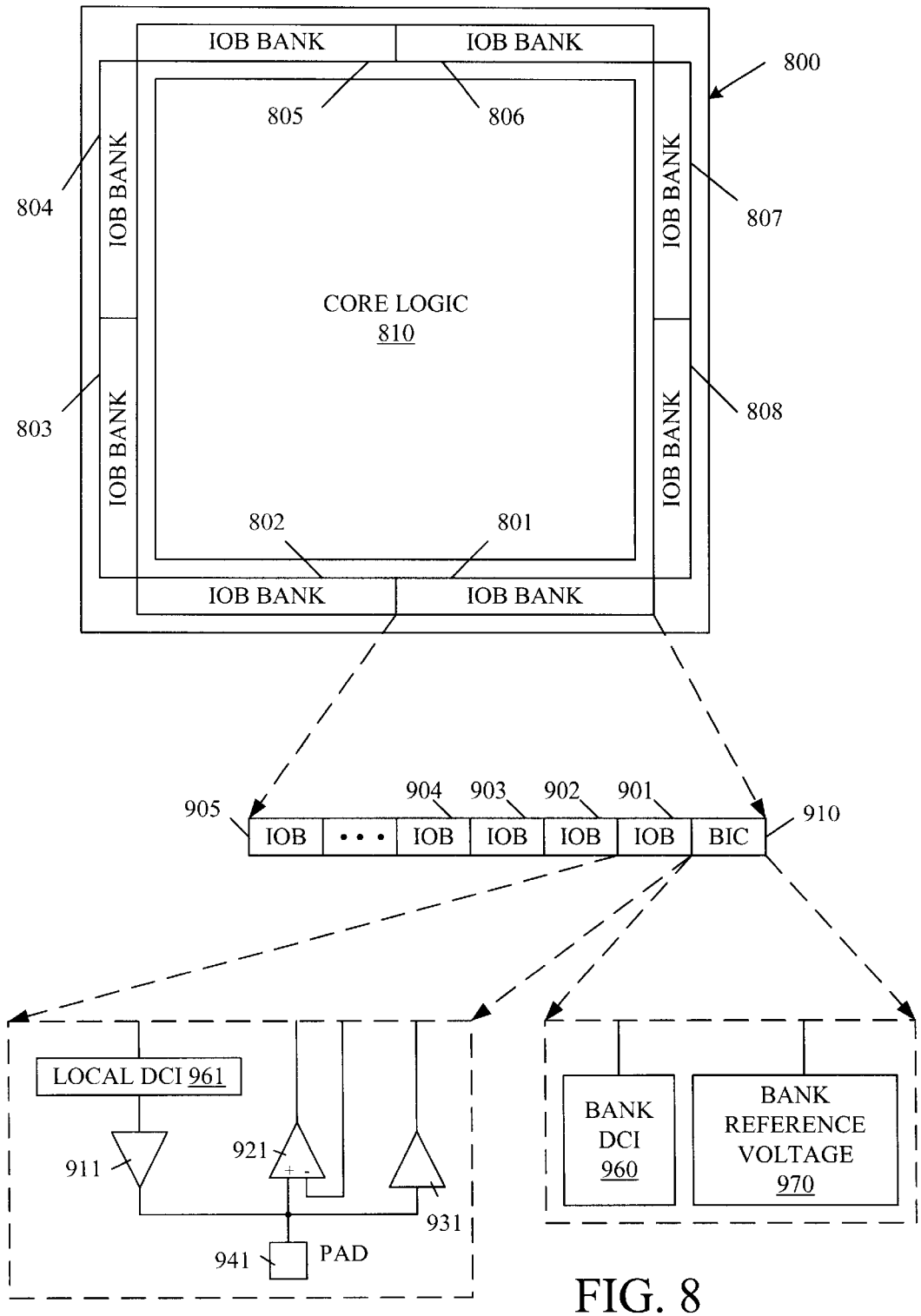
FIG. 8 is a block diagram of an integrated circuit chip, which implements one embodiment of the present invention.

FIG. 8 is a block diagram of an integrated circuit chip 800, which implements one embodiment of the present invention. IC chip 800 includes eight input/output block (IOB) banks 801–808 and core logic 810. IOB banks 801–808 are substantially identical. In a particular embodiment, core logic 810 includes an array of configurable logic blocks and programmable interconnect circuitry. However, other core logic is contemplated and considered to fall within the scope of the present invention. In general, IOB banks 801–808 provide an interface between core logic 810 and circuitry external to chip 800.

In the described embodiment, two IOB banks are located along each edge of IC chip 800, with each IOB bank having 20 to 150 IOBs. An exploded view illustrates that IOB bank 801 includes a plurality of IOBs 901–905 and a bank impedance control (BIC) circuit 910. A further exploded view illustrates that IOB 901 includes output driver circuit 911, comparator 921, input buffer circuit 931, I/O pad 941 and local digitally controlled impedance (DCI) circuit 961. Yet another exploded view illustrates that bank impedance control circuit 910 includes a bank digitally controlled impedance (DCI) circuit 960 and bank reference voltage generator 970. As described in more detail below, local DCI circuit 961 and bank DCI circuit 960 combine to perform the functions of DCI circuit 201 (FIGS. 2–3B). As also described in more detail below, bank reference voltage generator 970 provides the reference voltages that are used by IOBs 901–905. Thus, bank reference voltage generator 970 performs the functions of reference voltage circuits 311 and 411 (FIGS. 3 and 3B).

In another embodiment, only one bank impedance control circuit 910 is provided for the entire chip 800. In this embodiment, bank impedance control circuit 910 provides the necessary control for all of the local DCI circuits on chip 800. In another embodiment, there are multiple bank impedance control circuits, which are capable of controlling one or more IOB banks.

Figure 9:
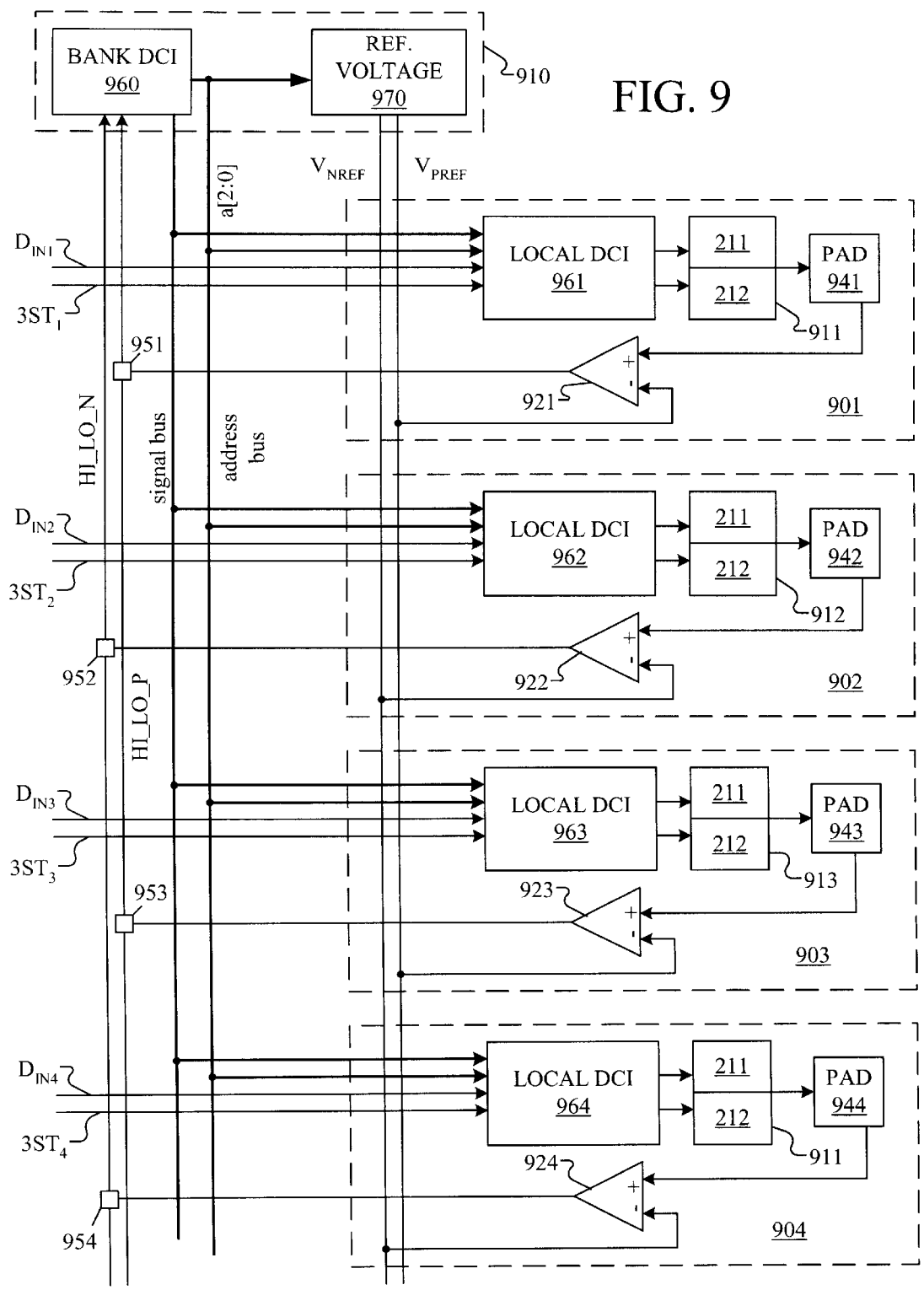
FIG. 9 is a circuit diagram illustrating selected portions of an IOB bank, including a bank impedance control circuit and selected IOBs.

FIG. 9 is a circuit diagram illustrating selected portions of IOB bank 801, including bank impedance control circuit 910 and IOBs 901–904. Note that the input buffer circuits (e.g., input buffer circuit 931) are not shown in FIG. 9 for purposes of clarity. IOBs 901–904 include respective local DCI circuits 961–964, respective output driver circuits 911–914, respective comparators 921–924 and respective I/O pads 941–944. Each of output driver circuits 911–914 includes a set of p-channel transistors 211 and a set of n-channel transistors 212, as described above in connection with FIGS. 2–4.

Reference voltage generator 970 provides the n-channel reference voltage, $V_{NREF}$, and the p-channel reference voltage $V_{PREF}$, on lines that extend through IOB bank 801. The comparator in every odd numbered IOB (e.g., 901, 903, 905) in IOB bank 801 is coupled to receive the $V_{PREF}$ voltage. The comparator in every even numbered IOB (e.g., 902, 904) in IOB bank 801 is coupled to receive the $V_{NREF}$ voltage.

The output terminals of the comparators in odd numbered IOBs are coupled to programmable connections (e.g., 951, 953), which if programmed, will connect a corresponding comparator to a common HI_LO_P line. Similarly, the output terminals of the comparators in even numbered IOBs are coupled to programmable connections (e.g., 952, 954), which if programmed, will connect a corresponding comparator to a common HI_LO_N line. The HI_LO_P line and the HI_LO_N line are routed to bank DCI circuit 960.

Bank DCI circuit 960 also provides control signals to local DCI circuits 961–964 through a common signal bus. These control signals will be described in more detail below. An address bus allows bank DCI circuit 960 to assert addresses to local DCI circuits 961–964 and reference voltage generator 970. In this embodiment, the address bus is three bits wide, and is shown as a[2:0]. Note that the address bus can be of any width.

In general, IOB bank 801 operates as follows. One of the odd-numbered IOBs is selected to be a p-channel reference circuit (called herein "P reference IOB"), and one of the even-numbered IOBs is selected to be an n-channel reference circuit (called herein "N reference IOB"). This selection is made by setting a configuration memory bit in the local DCI circuit of each of these IOBs (as explained more clearly in connection with FIG. 11), and programming the connection to couple the output terminals of the comparators of these IOBs to the HI_LO_N and HI_LO_P lines. Although any one of the odd-numbered IOBs can be selected to be the p-channel reference circuit, IOB 901 is selected in the described embodiment. That is, even though each of the odd-numbered IOBs contains a comparator, the comparator output is not connected to HI_LO_P (thereby capable of sending output signals to bank DCI circuit 960) unless it is programmed as a reference IOB. Thus, a configuration memory bit in local DCI circuit 961 is set, and programmable connection 951 is enabled. In this way, comparator 921 and pad 941 act as comparator 303 and pad 202 in FIG. 3A, respectively. Similarly, although any one of the even-numbered IOBs can be selected to be the n-channel reference circuit, IOB 902 is selected in the described embodiment. That is, even though each of the even-numbered IOBs contains a comparator, the comparator output is not connected to HI_LO_N (thereby capable of sending output signals to bank DCI circuit 960) unless it is programmed as a reference IOB. Thus, a configuration memory bit in local DCI circuit 962 is set, and programmable connection 952 is enabled. In this way, comparator 922 and pad 942 act as comparator 403 and pad 202 in FIG. 3B, respectively.

In FIG. 9, each of the IOBs contains a comparator. However, the comparator is not used unless it is in a reference IOB. This design provides flexibility in choosing any IOB as a reference IOB.

Because IOB 901 is to serve as the p-channel reference circuit, a predetermined reference resistance $R_{PREF}$ is connected between pad 941 and the ground terminal in the manner illustrated in FIG. 3A. As a result, IOB 901 is configured in substantially the same manner illustrated in FIG. 3A, except that the DCI circuit 201 of FIG. 3A has been divided into bank DCI circuit 960 and local DCI circuit 961.

Because IOB 902 is to serve as the n-channel reference circuit, a predetermined reference resistance $R_{NREF}$ is connected between pad 942 and an external $V_{CC}$ supply terminal in the manner illustrated in FIG. 3B. As a result, IOB 902 is configured in substantially the same manner illustrated in FIG. 3B, except that the DCI circuit 201 of FIG. 3B has been divided into bank DCI circuit 960 and local DCI circuit 962.

In general, IOB bank 801 operates as follows. P reference IOB 901 and N reference IOB 902 are initially set to have predetermined turned-on p-channel and n-channel transistors. During a first time period, bank DCI circuit 960 processes the HI_LO_P signal provided by P reference IOB 901. In response, bank DCI circuit 960 instructs local DCI circuit 961 to enable/disable the p-channel transistors in driver circuit 911 in the manner described above in connection with FIG. 3A. At the same time, bank DCI circuit 960 also instructs other local DCI circuits to enable/disable the same p-channel transistors as local DCI circuit 961. Thus, when logic low data signals $D_{IN3}$ and $D_{IN4}$ are applied to local DCI circuits 963–964, these local DCI circuits will enable the same p-channel transistors determined by the P reference IOB 901. For example, if bank DCI circuit 960 instructs local DCI circuit 961 in the P reference IOB 901 to enable fine p-channel transistors P1–P4 and coarse p-channel transistor P14, then bank DCI circuit 960 will similarly instruct local DCI circuit 963 to enable fine p-channel transistors P1–P4 and coarse p-channel transistor P14 when data signal $D_{IN3}$ has a logic low value.

During a second time period, bank DCI circuit 960 processes the HI_LO_N signal provided by N reference IOB 902. In response, bank DCI circuit 960 instructs local DCI circuit 962 to enable/disable the n-channel transistors in driver circuit 912 in the manner described above in connection with FIG. 3B. Bank DCI circuit 960 also instructs other local DCI circuits to enable/disable the same n-channel transistors as local DCI circuit 962. Thus, if bank DCI circuit 960 instructs local DCI circuit 962 in N reference IOB 902 to enable fine n-channel transistors N1–N2 and coarse n-channel transistor N13, then bank DCI circuit 960 will similarly instruct local DCI circuit 963 to enable fine n-channel transistors N1–N2 and coarse n-channel transistor N13 when data signal $D_{IN3}$ has a logic high value.

In accordance with another embodiment, the IOB 904 can be configured in a manner different than IOB 903. For example, output driver circuit 913 of IOB 903 can be configured in response to different reference voltages ($V_{NREF}$ and $V_{PREF}$) than output driver circuit 914 of IOB 904. As a result, output driver circuit 913 will exhibit different resistances than output driver circuit 914. This is accomplished by providing different sets of reference voltages with reference voltage supply 970.

Reference voltage supply 970 can be controlled to provide different reference voltages $V_{PREF}$ and $V_{NREF}$ at different times. For example, reference voltage supply 970 can be controlled to provide a first set of reference voltages that are used by P and N reference IOBS 901 and 902 to determine the appropriate p-channel and n-channel transistors to be enabled within IOB 903. Reference voltage supply 970 can also be controlled to provide a second set of reference voltages that are used by P and N s-reference IOBs 901 and 902 to determine the appropriate p-channel and n-channel transistors to be enabled within IOB 904. In the described embodiment, reference voltage supply 970 can be controlled to provide up to four sets of reference voltages (but another embodiment may provide more or less sets of reference voltages). By providing different reference voltages, the on-resistances of different output driver circuits can be controlled to have different values, even though the resistances of the external reference resistors 305 and 405 remain constant. Bank DCI circuit 960 is able to address the local DCI circuits 961–964, such that the appropriate information is provided to the appropriate IOBs.

Figure 10:
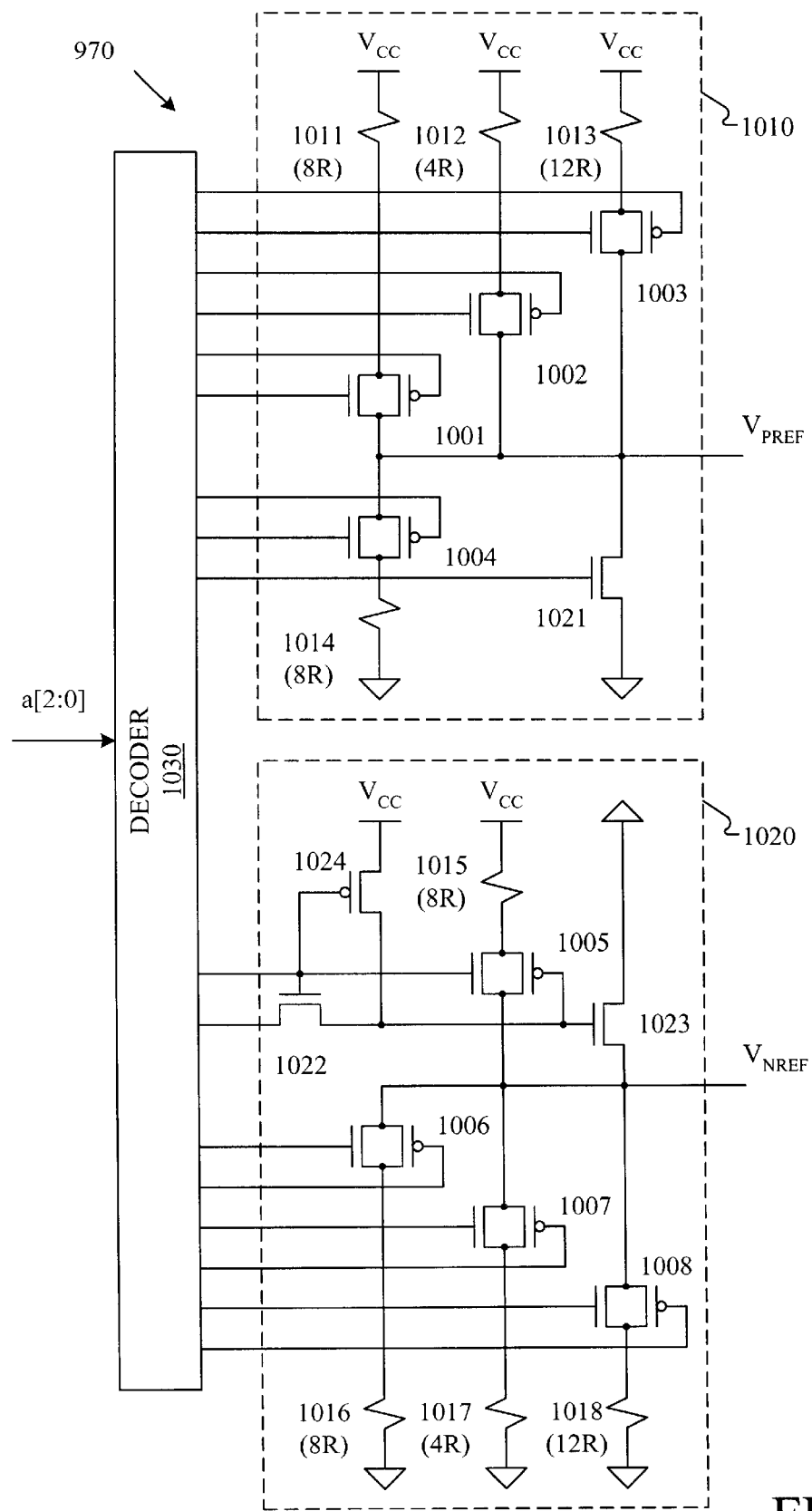
FIG. 10 is a circuit diagram of a reference voltage supply in accordance with one embodiment of the present invention.

FIG. 10 is a circuit diagram of reference voltage 970 in accordance with one embodiment of the present on. Reference voltage supply 970 includes p-channel reference voltage generator 1010, n-channel reference voltage generator 1020 and decoder circuit 1030. P-channel reference voltage generator 1010 includes transmission gates 1001–1004, resistors 1011–1014 and n-channel transistor 1021. Resistors 1011, 1012, 1013 and 1014 have relative resistances of 8R, 4R, 12R and 8R, respectively. N-channel reference voltage generator 1020 includes transmission gates 1005–1008, resistors 1015–1018, n-channel transistors 1022–1023 and p-channel transistor 1024. Resistors 1015, 1016, 1017 and 1018 have relative resistances of 8R, 8R, 4R and 12R, respectively. Decoder circuit receives address signals a[2:0] from bank DCI circuit 960, and in response, provides control signals to transmission gates 1001–1008 and transistors 1021–1023. Table 1 summarizes the status of transmission gates 1001-1004, transistor 1021 and the p-channel reference voltage $V_{PREF}$ the various address signals a[2:0].

TABLE 1

| a[2:0] | 1001 | 1002 | 1003 | 1004 | 1021 | $V_{PREF}$ |
|---|---|---|---|---|---|---|
| 000 | OFF | OFF | OFF | OFF | ON | 0 |
| 101 | | | | | | |
| 110 | | | | | | |
| 111 | | | | | | |
| 001 | ON | OFF | OFF | ON | OFF | $V_{CC}/2$ |
| 010 | OFF | ON | OFF | ON | OFF | $2V_{CC}/3$ |
| 011 | ON | OFF | OFF | ON | OFF | $V_{CC}/2$ |
| 100 | OFF | OFF | ON | ON | OFF | $2V_{CC}/5$ |

Table 2 summarizes the status of transmission gates 1005–1008, transistor 1022–1024 and the n-channel reference voltage $V_{NREF}$ for the various address signals a[2:0].

TABLE 2

| a[2:0] | 1005 1022 | 1006 | 1007 | 1008 | 1023 1024 | $V_{NREF}$ |
|---|---|---|---|---|---|---|
| 000 | OFF | OFF | OFF | OFF | ON | 0 |
| 101 | | | | | | |
| 110 | | | | | | |
| 111 | | | | | | |
| 001 | ON | ON | OFF | OFF | OFF | $V_{CC}/2$ |
| 010 | ON | OFF | ON | OFF | OFF | $V_{CC}/3$ |
| 011 | ON | ON | OFF | OFF | OFF | $V_{CC}/2$ |
| 100 | ON | OFF | OFF | ON | OFF | $3V_{CC}/5$ |

Addresses of "001" or "010" are used to provide DCI output driver circuits with different impedances (FIG. 5A). An address of "011" is used to provide a single termination pull-up to $V_{CC}$ (FIG. 6B). An address of "100" to provide a split termination to $V_{CC}$ and ground 7B).

Figure 11:
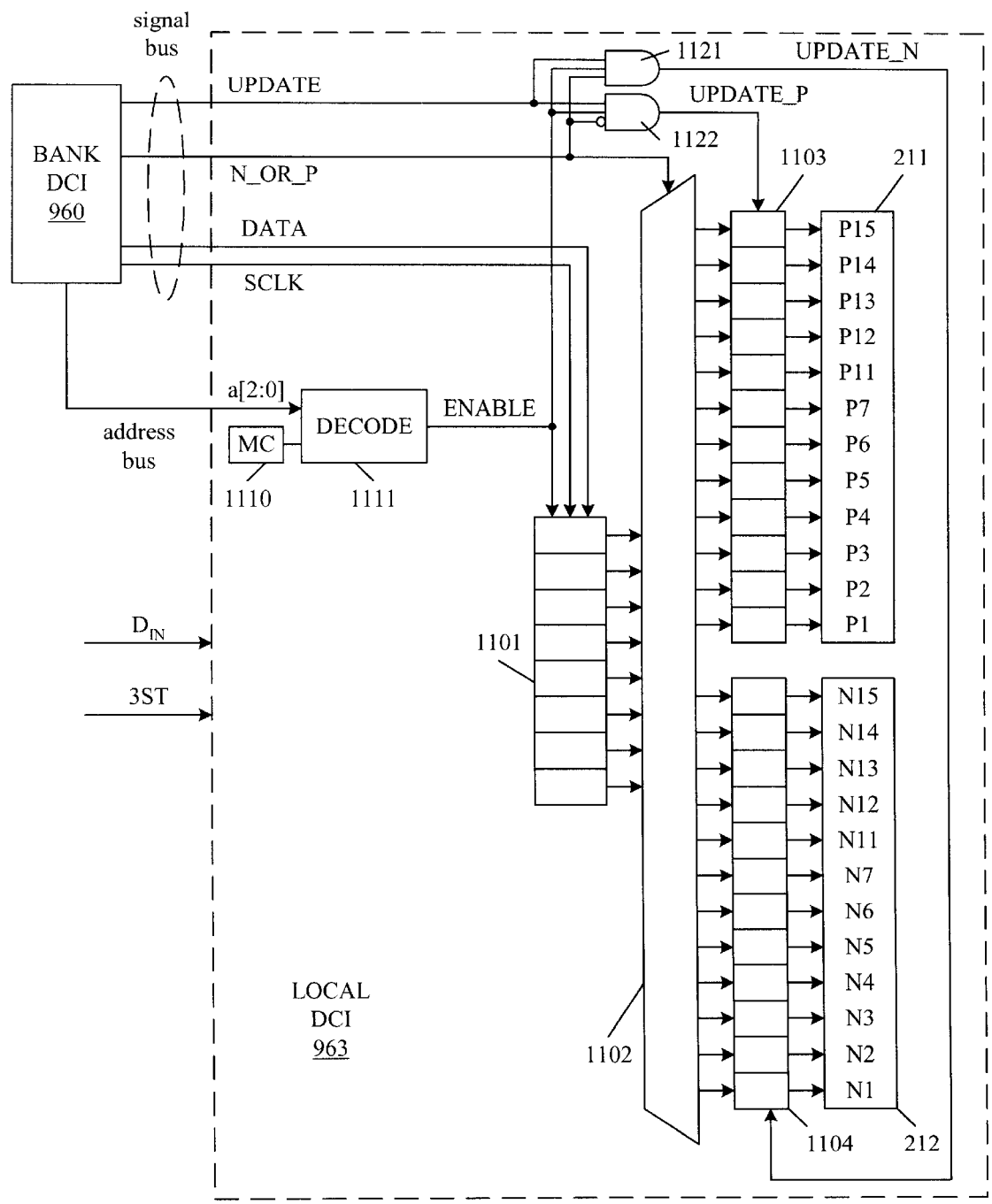
FIG. 11 is a block diagram illustrating a bank digitally controlled impedance (DCI) circuit and a local DCI circuit.

FIG. 11 is a block diagram illustrating bank DCI 960 and local DCI circuit 963 in more detail. DCI circuits 961–962 and 964 are identical to local DCI circuit 963.

Local DCI circuit 963 includes shift register 1101, data decoder 1102, p-channel register 1103, n-channel register 1104, configuration memory cells 1110, address decoder 1111 and logical AND gates 1121–1122. Bank DCI circuit 660 and local DCI circuit 663 operate as follows in accordance with one embodiment of the present invention.

Configuration memory cells 1110 store four configuration bits (but memory cells 1110 may store more or less configuration bits in other embodiments). One of these configuration bits indicates whether IOB 903 will serve as a reference IOB. If this configuration bit is set, then address decoder 1111 will assert an ENABLE signal regardless of the state of the applied address signal a[2:0]. The remaining three configuration bits identify a "type" output driver circuit 913 (assuming that IOB 903 is not reference IOB). There are five "types" of output driver circuits in accordance with the described embodiment (but the invention is not limited to five types). Table 3 defines the reference voltages used for each of the five types. Note that the contents of configuration memory cells 1110 will correspond with one of the address signals a[2:0].

TABLE 3

| Type Configuration Memory Cells 1110 | $V_{PREF}$ | $V_{NREF}$ |
|---|---|---|
| 000, 101, 110, 111 | 0 | 0 |
| 001 | $V_{CC}/2$ | $V_{CC}/2$ |
| 010 | $V_{CC}/3$ | $2V_{CC}/3$ |
| 011 | $V_{CC}/2$ | $V_{CC}/2$ |
| 100 | $3V_{CC}/5$ | $2V_{CC}/5$ |

If the address signal a[2:0] from bank DCI circuit 960 matches the contents of configuration memory cells 1110, then address decoder 1111 will assert an ENABLE signal, thereby enabling shift register 1101. In response to this ENABLE signal (and a clock signal (SCLK) provided by bank circuit 960), shift register 1101 will sequentially shift in the DATA signal provided by bank DCI circuit 960. The DATA signal identifies the p-channel transistors 211 or the n-channel transistors 212 to be turned on during the present iteration. Shift register 1101 provides the loaded DATA values to data decoder 1102. In the described embodiment, shift register 1101 is an 8-bit wide register. As explained below, these bits can be used to enable/disable twelve transistors.

Bank DCI circuit 960 provides a N_OR_P control signal to data decoder 1102, thereby indicating whether the contents of shift register 1101 are intended to control the p-channel transistors 211 (N_OR_P=0), or the n-channel transistors 212 (N_OR_P=1) of output driver circuit 913. Bank DCI circuit 960 initially provides a N_OR_P signal having a logic "0" value. In response, data decoder 1102 will decode the contents of shift register 1101, and transmit the results to p-channel register 1103.

Bank DCI circuit 960 then asserts a logic high UPDATE signal, which causes AND gate 1121 to assert a logic high UPDATE_P signal. In response, p-channel register 1103 loads the results provided by data decoder 1102. The contents of p-channel register 1103 are then used to control p-channel transistors P1–P7 and P11–P15 in the manner described above.

Data decoder 1102 operates as follows. Data decoder receives the 8-bit signal D[7:0] from shift register 1101. The D[7:0] signal includes five bits D[7:3] to control coarse transistors (i.e., coarse p-channel transistors P11–P15 or coarse n-channel transistors N11–N15). These five bits D[7:3] are routed directly through decoder 1102 to either register 1103 or 1104 in response to the N_OR_P signal. The D[7:0] signal also includes three bits D[2:0] to control fine transistors (i.e., fine p-channel transistors P1–P7 or fine n-channel transistors N1–N7). These three bits can be decoded into eight different values. One of the values corresponds to a case in which no fine transistors are turned on. Decoder 1102 provides signals that will turn on the corresponding number of fine transistors in response to the D[2:0] bits.

The signals $D_{IN}$ and 3ST applied to local DCI 963 operate in the same way as described above in connection with FIG. 2. That is, (a) if 3ST signal has a logic low value and the $D_{IN}$ signal has a logic low value, one or more of the P transistors will be turned on, (b) if the 3ST has a logic low value and the $D_{IN}$ signal has a logic high value, one or more of the N transistors will be turned on, and (c) if the 3ST signal has a logic high value, the output driver circuit is tri-stated.

The operation of IOB bank 801 will now be summarized. First, one of IOBs 901–905 is configured as a P reference IOB, and another one of IOBs 901–905 is configured as an N reference IOB. The remaining IOBs are configured to have a particular 'type' (e.g., a first type, a second type, etc.) by appropriately programming the configuration memory cells 1110 within the IOBs.

Bank DCI circuit 960 then asserts a first address signal $a_1[2:0]$ (e.g., "001") and provides a sequence of data on the DATA signal line that corresponds to a first data signal $D_1[7:0]$ to be shifted into shift register 1101. The first address signal $a_1[2:0]$ also causes reference voltage circuit 970 to generate a first pair of reference voltages $V_{PREF1}$ and $V_{NREF1}$ (e.g., $V_{CC}/2$ and $V_{CC}/2$), as explained above in connection with Tables 1 and 2. The first data signal $D_1[7:0]$, which identifies p-channel transistors to be enabled, is latched into the P reference IOB. The first address signal $a_1[2:0]$ also causes the first data signal $D_1[7:0]$ to be latched into all of the IOBs of the first type.

The bank DCI circuit 960 also provides a logic low N_OR_P signal and a logic high UPDATE signal, thereby causing the first data signal $D_1[7:0]$ to be decoded and used to control the p-channel transistors in both the P reference IOB and the IOBs of the first type. In response, the P reference IOB provides a HI_LO_P signal having a logic high or low value to bank DCI circuit 960. This process is repeated until the P reference IOB has provided the desired p-channel settings to all of the IOBs of the first type.

The address signal a[2:0] is then incremented to a second address (e.g., "010"), such that the reference voltage circuit 970 generates a second pair of reference voltages. In response, the P reference IOB is used to provide the desired p-channel settings to all of the IOBs of the second type.

This process is repeated such that the desired p-channel settings are provided for all of the different types of IOBS. The n-channel reference circuit is then used to provide the desired n-channel settings for the different types of IOBs.

To provide the desired settings for the n-channel transistors, bank DCI circuit 960 asserts the first address signal $a_1[2:0]$ and then provides a sequence of data on the DATA signal line that corresponds to a data signal $D_2[7:0]$ to be shifted into shift register 1101. This data signal $D_2[7:0]$, which identifies n-channel transistors to be enabled, is latched into the N reference IOB. The first address signal $a_1[2:0]$ also enables the second data signal $D_2[7:0]$ to be latched into all of the IOBs of the first type.

The bank DCI circuit 960 also provides a logic high N_OR_P signal and a logic high UPDATE signal, thereby causing the data signal $D_2[7:0]$ to be decoded and used to control the n-channel transistors in both the N reference IOB and the IOBs of the first type. In response, the N reference IOB provides a HI_LO_N signal having a logic high or low value to bank DCI circuit 960. This process is repeated until the n-channel reference circuit has provided the desired n-channel settings to all of the IOBs of the first type.

The address signal a[2:0] is then incremented to the second type ("010"), such that the reference voltage circuit 970 generates a second pair of reference voltages. In response, the N reference IOB is used to provide the desired n-channel settings to all of the IOBs of the second type.

This process is repeated such that the desired n-channel settings are provided for all of the different types of IOBs. The process then repeats, with the p-channel transistor settings being updated for the various types, and then the n-channel transistor settings being updated for the various types. In this manner, the p-channel and n-channel determinations are continuously being updated for each type during operation of the chip.

Note that IOBs can be excluded from this process by programming the configuration memory cells 1110 to store a 3-bit value of "000", "101", "110" or "111". In this case, the p-channel and n-channel transistors to be enabled are determined by the user programming configuration memory cells.

Although the invention has been described in connection with several embodiments, it is understood that this invention is not limited to the embodiments disclosed, but is capable of various modifications which would be apparent to a person skilled in the art. For example, although the present invention has been described in connection with the control of output driver circuits, it is understood that the invention can be applied to circuits which do not drive output signals. For example, the invention can be applied to select which parallel-connected transistors should be turned on between any node and a voltage supply terminal. In addition the DCI block 201 can be implemented as a state machine. In addition, although p-channel transistors have been used as pull-up elements, and n-channel transistors have been used as pull-down elements, n-channel transistors can be used as pull-up elements and p-channel transistors can be used as pull-down elements in other embodiments. Thus, the invention is limited only by the following claims.

We claim:

1. An integrated circuit comprising:
   a reference voltage generator that generates a reference voltage;
   a bank control circuit that generates a first control signal;
   a first voltage terminal; and
   a plurality of output circuits each comprising:
      an output pad;
      a plurality of transistors coupled in parallel between the first voltage terminal and the output pad;
      a comparator having an input terminal coupled to the output pad, and
      a local control circuit used to selectively enable a set of the plurality of transistors in response to the first control signal such that an impedance of the set of the plurality of transistors has a predetermined relationship with a resistance impedance coupled to the pad;
   wherein the comparator intone of the plurality of output circuits generates a second control signal in response the reference voltage and a voltage on the pad in the one of the plurality of output circuits; and
   the bank control circuit generating the first control signal in response to the second control signal.

2. The integrated circuit of claim 1 wherein the reference voltage generated by the reference voltage generator can have one of a plurality of programmable values.

3. The integrated circuit of claim 2 wherein the reference voltage generator accepts digital values from the bank control circuit and the programmable values are associated with the digital values.

4. The integrated circuit of claim 3 wherein the reference voltage generator comprises a plurality of transmission gates that are controlled by the digital values.

5. The integrated circuit of claim 3 wherein the digital values are generated by the bank control circuit.

6. The integrated circuit of claim 1 wherein each of the output circuits further comprises a memory cell that stores a respective address value and a decoder adapted to generate an enable signal when it receives a value that is same as the address value stored in the memory cell, the enable signal being used to enable its associated local control circuit, and wherein the bank control circuit generates an address data for delivering to the decoder of each of the output circuits, the address data being used by the decoder to enable one of the output circuits.

7. The integrated circuit of claim 6 wherein the reference voltage generated by the reference voltage generator can have one of a plurality of programmable values.

8. The integrated circuit of claim 7 wherein the reference voltage generator accepts the address data from the bank control circuit and the programmable values are associated with the address data.

9. The integrated circuit of claim 8 wherein the reference voltage generator comprises a plurality of transmission gates that are controlled by the address data.

10. The integrated circuit of claim 6 wherein each of the local control circuit further comprises a shift register controlled by the decoder, wherein the bank control circuit delivers serial data stream to the shift register, and wherein the shift register converts the serial data stream into parallel form, the data stream being used to selectively enable the set of plurality of transistors.

11. The integrated circuit of claim 10 wherein the reference voltage generated by the reference voltage generator can have one of a plurality of programmable values.

12. The integrated circuit of claim 11 wherein the reference voltage generator comprises a plurality of transmission gates that are controlled by the address data.

13. The integrated circuit of claim 1 further comprising core logic that delivers output digital data to the plurality of output circuits.

14. The integrated circuit of claim 13 wherein each of the output circuits further comprises a memory cell that stores a respective address value and a decoder adapted to generate an enable signal when it receives a value that is same as the address value stored in the memory cell, the enable signal being used to enable its associated local control circuit, and wherein the bank control circuit generates an address data for delivering to the decoder of each of the output circuits, the address data being used by the decoder to enable one of the output circuits.

15. The integrated circuit of claim 14 wherein each of the local control circuit further comprises a shift register controlled by the decoder, wherein the bank control circuit delivers serial data stream to the shift register, and wherein the shift register converts the data stream into parallel form, the data stream being used to selectively enable the set of plurality of transistors.

16. The integrated circuit of claim 14 wherein the reference voltage generated by the reference voltage generator can have one of a plurality of programmable values.

17. The integrated circuit of claim 16 wherein the reference voltage generator comprises a plurality of transmission gates that are controlled by the address data.

18. An integrated circuit comprising:
   a first voltage terminal;
   a core logic portion; and
   a plurality of input-output banks interacting with the core logic portion, each bank comprising:
      a bank circuit having a reference voltage generator that generates a reference voltage and a bank control circuit that generates a first control signal; and
      a plurality of output circuits each comprising:
         an input buffer circuit;
         an output pad;
         a plurality of transistors coupled in parallel between the first voltage terminal and the output pad;
         a comparator having an input terminal coupled to the output pad, and
         a local control circuit used to selectively enable a set of the plurality of transistors in response to the first control signal such that an impedance of the set of the plurality of transistors has a predetermined relationship with a resistance impedance coupled to the pad;
   wherein the comparator in one of the plurality of output circuits generates a second control signal in response the reference voltage and a voltage on the pad in the one of the plurality of output circuits; and
   the bank control circuit generating the first control signal in response to the second control signal.

19. The integrated circuit of claim 18 wherein the reference voltage generated by the reference voltage generator can have one of a plurality of programmable values.

20. The integrated circuit of claim 19 wherein the reference voltage generator accepts digital values from the bank control circuit and the programmable values are associated with the digital values.

21. The integrated circuit of claim 20 wherein the reference voltage generator comprises a plurality of transmission gates that are controlled by the digital values.

22. The integrated circuit of claim 20 wherein the digital values are generated by the bank control circuit.

23. The integrated circuit of claim 18 wherein each of the output circuits further comprises a memory cell that stores a respective address value and a decoder adapted to generate an enable signal when it receives a value that is same as the address value stored in the memory cell, the enable signal being used to enable its associated local control circuit, and wherein the bank control circuit generates an address data for delivering to the decoder of each of the output circuits, the address data being used by the decoder to enable one of the output circuits.

24. The integrated circuit of claim 23 wherein each of the local control circuit further comprises a shift register controlled by the decoder, wherein the bank control circuit delivers serial data stream to the shift register, and wherein the shift register converts the data stream into parallel form, the data stream being used to selectively enable the set of plurality of transistors.

* * * * *